United States Patent
Uematsu et al.

(10) Patent No.: US 11,891,720 B2
(45) Date of Patent: Feb. 6, 2024

(54) GALLIUM ARSENIDE SINGLE CRYSTAL SUBSTRATE AND METHOD FOR PRODUCING GALLIUM ARSENIDE SINGLE CRYSTAL SUBSTRATE

(71) Applicant: SUMITOMO ELECTRIC INDUSTRIES, LTD., Osaka (JP)

(72) Inventors: Koji Uematsu, Osaka (JP); Issei Satoh, Osaka (JP); Fumitake Nakanishi, Hyogo (JP)

(73) Assignee: Sumitomo Electric Industries, Ltd., Osaka (JP)

(*) Notice: Subject to any disclaimer, the term of this patent is extended or adjusted under 35 U.S.C. 154(b) by 67 days.

(21) Appl. No.: 17/784,653

(22) PCT Filed: Sep. 1, 2020

(86) PCT No.: PCT/JP2020/033077
§ 371 (c)(1),
(2) Date: Jun. 12, 2022

(87) PCT Pub. No.: WO2021/176750
PCT Pub. Date: Sep. 10, 2021

(65) Prior Publication Data
US 2023/0002931 A1 Jan. 5, 2023

(51) Int. Cl.
*B32B 3/00* (2006.01)
*C30B 29/42* (2006.01)
(Continued)

(52) U.S. Cl.
CPC .............. *C30B 29/42* (2013.01); *C30B 33/02* (2013.01); *G01N 23/2273* (2013.01)

(58) Field of Classification Search
CPC ...................................................... C30B 29/42
See application file for complete search history.

(56) References Cited

U.S. PATENT DOCUMENTS

| 2001/0012547 A1* | 8/2001 | Kihara ................... C30B 29/42 428/34.1 |
| 2005/0208687 A1 | 9/2005 | Kasai et al. |

(Continued)

FOREIGN PATENT DOCUMENTS

| JP | 3232833 B2 | 6/1995 |
| JP | H10-012577 A | 1/1998 |

(Continued)

OTHER PUBLICATIONS

JP-2013541212-A (Year: 2013).*

(Continued)

*Primary Examiner* — Elizabeth E Mulvaney
(74) *Attorney, Agent, or Firm* — Renner, Otto, Boisselle & Sklar, LLP

(57) ABSTRACT

A gallium arsenide single crystal substrate having a main surface, in which a ratio of the number of As atoms existing as diarenic trioxide to the number of As atoms existing as diarsenic pentoxide is greater than or equal to 2 when the main surface is measured by X-ray photoelectron spectroscopy, in which an X-ray having energy of 150 eV is used and a take-off angle of a photoelectron is set to 5°. Arithmetic average roughness (Ra) of the main surface is less than or equal to 0.3 nm.

11 Claims, 5 Drawing Sheets

(51) Int. Cl.
*C30B 33/02* (2006.01)
*G01N 23/2273* (2018.01)

(56) References Cited

U.S. PATENT DOCUMENTS

| | | |
|---|---|---|
| 2008/0219910 A1 | 9/2008 | Kasai et al. |
| 2008/0296738 A1 | 12/2008 | Nishiura et al. |
| 2011/0024718 A1 | 2/2011 | Gradecak et al. |
| 2019/0257002 A1 | 8/2019 | Fujiwara et al. |

FOREIGN PATENT DOCUMENTS

| | | |
|---|---|---|
| JP | H10-036199 A | 2/1998 |
| JP | 2004-139746 A | 5/2004 |
| JP | 2005-298319 A | 10/2005 |
| JP | 2008-300747 A | 12/2008 |
| JP | 2014-082169 A | 5/2014 |
| WO | 2014/124980 A2 | 8/2014 |
| WO | 2018/216203 A1 | 11/2018 |

OTHER PUBLICATIONS

T. Tanimoto et al., "Reduction of Schottky Reverse Leakage Current Using GaAs Surface Cleaning with UVO3 Treatment", Japanese Journal of Applied Physics, vol. 38, No. 7A, Jul. 1, 1999, pp. 3982-3985.

K. Iiyama et al., "Fabrication of GaAs MISFET with nm-Thin Oxidized Layer Formed by UV and Ozone Process", IEEE Transactions of Electron Devices, vol. 49, No. 11, Nov. 2002, pp. 1856-1862.

Z. H. Lu et al., "Ultraviolet-ozone oxidation of GaAs(100) and InP(100)", 8257b Journal of Vacuum Science and Technology, Part B, vol. 11, Nov./Dec. 1993, No. 6, Thorofare, NJ, pp. 2033-2037.

"Method for Estimating Inelastic Mean Free Path of Electron by Tpp-2M", Journal of Surface Analysis, vol. 1, No. 2, 1995 (cited in specification).

Yukihiro Hirota et al., "Clean and Damage-Free GaAs Surface Prepared by Using the Ultrasonic Running Deionized Water Treatment", Surface Science, 1991, vol. 12, No. 6, pp. 380 to 392 (w/ English Abst .; cited in specification; and concise explanation in Written Opinion of the ISA issued in Application No. PCT/JP2020/008590).

Teruo Tsunoda, "Cleaning Technology of Electronic Materials", Journal of Japan Oil Chemists' Society, 1986, vol. 35, No. 10, pp. 867 to 872 (cited in specification; and concise explanation in Written Opinion of the ISA issued in Application No. PCT/JP2020/008590).

Written Opinion of the ISA issued in Application No. PCT/JP2020/008590, dated Apr. 14, 2020.

\* cited by examiner

GALLIUM ARSENIDE SINGLE CRYSTAL SUBSTRATE AND METHOD FOR PRODUCING GALLIUM ARSENIDE SINGLE CRYSTAL SUBSTRATE

The present disclosure relates to a gallium arsenide single crystal substrate and a method for producing the gallium arsenide single crystal substrate. The present application claims priority based on International Application PCT/JP2020/008590 filed on Mar. 2, 2020. All descriptions described in International Application PCT/JP2020/008590 are incorporated herein by reference.

TECHNICAL FIELD

Background Art

WO 2014/124980 (PTL 1) discloses a method for producing a gallium arsenide substrate. That is, the producing method includes the following processes a) to d).

a) A process of preparing a gallium arsenide substrate, b) A process of oxidizing at least one surface of the gallium arsenide substrate in a dry state using ultraviolet irradiation and/or an ozone gas, c-1) A process of bringing an aqueous alkali solution into contact with the at least one surface of the gallium arsenide substrate, c-2) Thereafter, a process of bringing water into contact with the at least one surface of the gallium arsenide substrate, c-3) Thereafter, a process of bringing an acidic aqueous solution into contact with the at least one surface of the gallium arsenide substrate, c-4) Thereafter, a process of bringing water into contact with the at least one surface of the gallium arsenide substrate, and d) A process of Marangoni drying the gallium arsenide substrate.

CITATION LIST

Patent Literatures

PTL 1: WO 2014/124980
PTL 2: Japanese Patent Laying-Open No. 10-36199
PTL 3: Japanese Patent Laying-Open No. 10-12577

NON PATENT LITERATURES

NPL 1: "Method for Estimating Inelastic Mean Free Path of Electron by Tpp-2M", Journal of Surface Analysis, Vol. 1, No. 2, 1995

NPL 2: Yukihiro Hirota et al., "Clean and Damage-Free GaAs Surface Prepared by Using the Ultrasonic Running Deionized Water Treatment", Surface Science, 1991, Vol. 12, No. 6, pp. 380 to 392

NPL 3: Teruo Tsunoda, "Cleaning Technology of Electronic Materials", Journal of Japan Oil Chemists' Society, 1986, Vol. 35, No. 10, pp. 867 to 872

SUMMARY OF INVENTION

A gallium arsenide single crystal substrate according to one aspect of the present disclosure is a gallium arsenide single crystal substrate having a main surface, and a ratio of a number of As atoms existing as diarsenic trioxide to a number of As atoms existing as diarsenic pentoxide is greater than or equal to 2 when the main surface is measured by X-ray photoelectron spectroscopy, in which an X-ray having an energy of 150 eV is used and a take-off angle (TOA) of a photoelectron is set to 5°. Arithmetic average roughness Ra of the main surface is less than or equal to 0.3 nm.

A method for producing a gallium arsenide single crystal substrate according to another aspect of the present disclosure includes: forming an oxide film on a main surface of a gallium arsenide single crystal substrate precursor using at least one of an ozone gas and an ultraviolet ray while the gallium arsenide single crystal substrate precursor is heated under a heating condition greater than or equal to 100° C. and less than or equal to 200° C.; and bringing the main surface into contact with an acidic aqueous solution to etch the oxide film.

DETAILED DESCRIPTION

Figure 1:
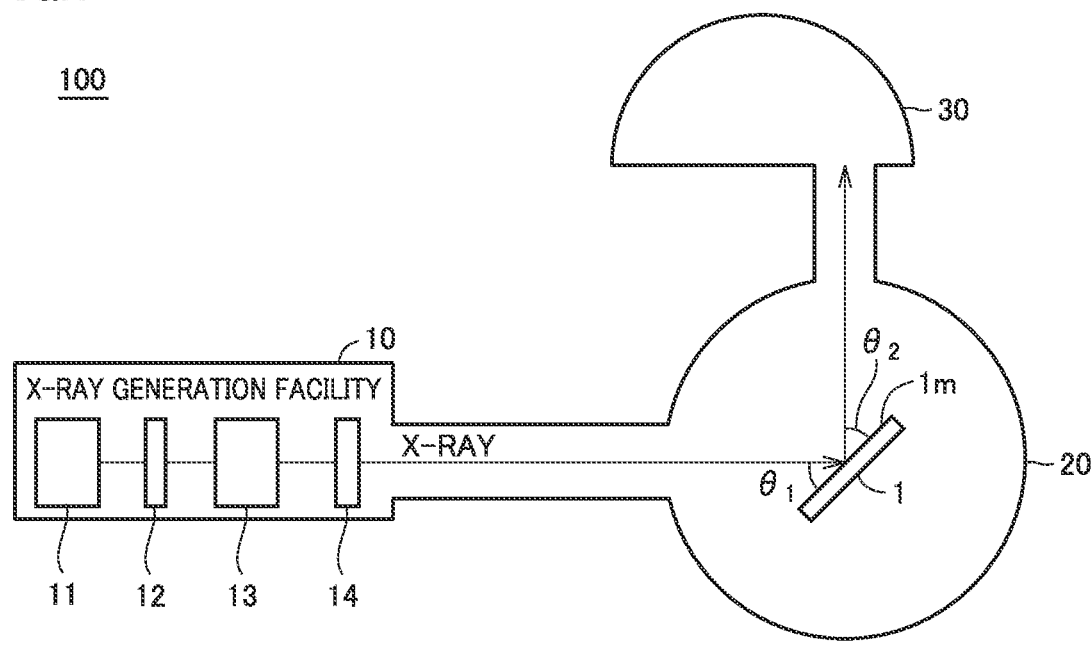
FIG. 1 is a view schematically illustrating a configuration of an analysis system using X-ray photoelectron spectroscopy.

Problem to be Solved by the Present Disclosure

There is a light point defect (LPD) as one of defects on the surface of the epitaxial film, and it is known that an increase in the number of defects correlates with a decrease in a device characteristic. LPD is a term used when surface smoothness (presence or absence of a step) of an epitaxial film is evaluated by irradiating a surface of the epitaxial film with light, and means that more steps exist on the surface of the epitaxial film as the number of LPDs increases. For example, the step is derived from a stacking fault generated when the epitaxial film is grown on the gallium arsenide single crystal substrate. Because the stacking fault depends on the smoothness of the surface of the gallium arsenide single crystal substrate, the number of LPDs is required to be reduced by implementing the gallium arsenide single crystal substrate having the high surface smoothness. Even for the gallium arsenide single crystal substrate disclosed in PTL 1, sometimes the number of LPDs is required to be further reduced.

In view of the above points, an object of the present disclosure is to provide a gallium arsenide single crystal substrate capable of forming the epitaxial film in which the number of LPDs is reduced, and a method for producing the gallium arsenide single crystal substrate.

Description of Embodiments of the Present Disclosure

First, embodiments of the present disclosure will be listed and described.

[1] A gallium arsenide single crystal substrate according to one aspect of the present disclosure is a gallium arsenide single crystal substrate having a main surface, and a ratio of a number of As atoms existing as diarsenic trioxide to a number of As atoms existing as diarsenic pentoxide is greater than or equal to 2 when the main surface is measured by X-ray photoelectron spectroscopy, in which an X-ray having an energy of 150 eV is used and a take-off angle of a photoelectron is set to 5°. Arithmetic average roughness Ra of the main surface is less than or equal to 0.3 nm. Although the detailed mechanism is unknown, the smoothness of the main surface of the gallium arsenide single crystal substrate having such characteristics is enhanced. Furthermore, the diarsenic trioxide is more easily decomposed by heat treatment than the diarsenic pentoxide. Therefore, in the heating treatment when the epitaxial film is formed, the As oxide existing on the main surface of the gallium arsenide single crystal substrate is uniformly removed, and the main surface of the gallium arsenide single crystal substrate is further smoothed. As a result, when the epitaxial film is formed on the main surface, the number of LPDs on the film surface of the epitaxial film can be reduced.

[2] When the main surface is measured by the X-ray photoelectron spectroscopy, the ratio of the number of As atoms existing as the diarsenic trioxide to the number of As atoms existing as the diarsenic pentoxide is preferably greater than or equal to 5. Thus, the smoothness of the main surface of the gallium arsenide single crystal substrate can be further enhanced, so that the number of LPDs on the film surface of the epitaxial film can be further reduced when the epitaxial film is formed on the main surface.

[3] The main surface is preferably a surface having an off angle greater than or equal to 0.01° and less than or equal to 15° from a (100) plane. Thus, the main surface becomes a surface having excellent electrical characteristic and optical characteristic. Thus, in the present disclosure, the epitaxial film can be formed on the surface having the excellent electrical characteristic and optical characteristic of the gallium arsenide single crystal substrate, and in this case, the number of LPDs on the film surface of the epitaxial film can be reduced.

[4] The gallium arsenide single crystal substrate preferably has a disk shape having a diameter greater than or equal to 75 mm and less than or equal to 300 mm. As described later, in the present disclosure, a large substrate having the diameter greater than or equal to 75 mm can be applied as a shape of the gallium arsenide single crystal substrate. Thus, the epitaxial film can be formed on the surface of the main surface of the large gallium arsenide single crystal substrate having the diameter greater than or equal to 75 mm, and in this case, the number of LPDs on the film surface of the epitaxial film can be reduced.

[5] In the gallium arsenide single crystal substrate, when nine measurement points on the main surface are measured by the X-ray photoelectron spectroscopy, the standard deviation of the ratio of the number of As atoms existing as the diarsenic trioxide to the number of As atoms existing as the diarsenic pentoxide is preferably less than or equal to 1. When the diameter is D mm, and when two axes that pass through the center of the main surface and are orthogonal to each other on the main surface are the X-axis and the Y-axis, the coordinates (X, Y) of the X-axis and the Y-axis of the nine measurement points are (0,0), (D/4,0), (0, D/4), (−D/4,0), (0, −D/4), ((D−40)/$8^{1/2}$, (D−40)/$8^{1/2}$), (−(D−40)/$8^{1/2}$, (D−40)/$8^{1/2}$), (−(D−40)/$8^{1/2}$, −(D−40)/$8^{1/2}$), and ((D−40)/$8^{1/2}$, −(D−40)/$8^{1/2}$). Thus, even in the large gallium arsenide single crystal substrate having the diameter greater than or equal to 75 mm, the number of LPDs on the film surface of the epitaxial film formed on the surface of the main surface can be uniformly reduced.

[6] The diameter of the gallium arsenide single crystal substrate is preferably greater than or equal to 150 mm and less than or equal to 200 mm. As illustrated in Examples (Samples 1 to 3 and 8) described later, the epitaxial film can also be formed on the main surface of the large GaAs single crystal substrate having the diameter greater than or equal to 150 mm and less than or equal to 200 mm, and in this case, the number of LPDs on the film surface of the epitaxial film can be reduced.

[7] A gallium arsenide single crystal substrate according to an aspect of the present disclosure is a gallium arsenide single crystal substrate having a main surface. The gallium arsenide single crystal substrate has a disk shape having the diameter greater than or equal to 75 mm and less than or equal to 300 mm. When nine measurement points on the main surface are measured by the X-ray photoelectron spectroscopy using the X-ray having the energy of 150 eV and setting the take-off angle of the photoelectrons to 5°, the average value of the ratios of the number of As atoms existing as diarsenic trioxide to the number of As atoms existing as diarsenic pentoxide is greater than or equal to 2, and a standard deviation of the ratios is less than or equal to 1. When the diameter is D mm, and when two axes that pass through the center of the main surface and are orthogonal to each other on the main surface are the X-axis and the Y-axis, the coordinates (X, Y) of the X-axis and the Y-axis of the nine measurement points are (0,0), (D/4,0), (0, D/4), (−D/4,0), (0, −D/4), ((D−40)/$8^{1/2}$, (D−40)/$8^{1/2}$), (−(D−40)/$8^{1/2}$, (D−40)/$8^{1/2}$), (−(D−40)/$8^{1/2}$, −(D−40)/$8^{1/2}$), and ((D−40)/$8^{1/2}$, −(D−40)/$8^{1/2}$). The average value of arithmetic average roughness Ra at the nine measurement points is less than or equal to 0.3 nm. Even in this configuration, when the epitaxial film is formed on the main surface, the number of LPDs on the film surface of the epitaxial film can be reduced. Furthermore, even in the large gallium arsenide single crystal substrate having the diameter greater than or equal to 75 mm, the number of LPDs on the film surface of the epitaxial film formed on the surface of the main surface can be uniformly reduced.

[8] A method for producing a gallium arsenide single crystal substrate according to another aspect of the present disclosure includes: forming an oxide film on a main surface of a gallium arsenide single crystal substrate precursor using at least one of an ozone gas and an ultraviolet ray while the gallium arsenide single crystal substrate precursor is heated under a heating condition greater than or equal to 100° C. and less than or equal to 200° C.; and bringing the main surface into contact with an acidic aqueous solution to etch the oxide film. In the method for producing the gallium arsenide single crystal substrate having such the characteristic, when the epitaxial film is formed on the main surface, the gallium arsenide single crystal substrate in which the number of LPDs on the film surface of the epitaxial film is reduced can be obtained.

[9] The heating condition is preferably greater than or equal to 150° C. and less than or equal to 200° C. Thus, when the epitaxial film is formed on the main surface, the gallium arsenide single crystal substrate in which the number of LPDs on the film surface of the epitaxial film is further reduced can be obtained.

[10] The acidic aqueous solution is preferably a solution containing hydrofluoric acid. Thus, the oxide film formed on the main surface of the gallium arsenide single crystal substrate precursor can be easily removed.

[11] The method for producing the gallium arsenide single crystal substrate preferably further includes, after the etching process, measuring the main surface by the X-ray photoelectron spectroscopy using an X-ray having the energy of 150 eV and setting a take-off angle of the photoelectrons to 5°, and analyzing a ratio of a number of As atoms existing as the diarsenic trioxide to the number of As atoms existing as the diarsenic pentoxide. Thus, an extreme surface of the main surface can be accurately analyze, and so, when the epitaxial film is formed on the main surface, the gallium arsenide single crystal substrate in which the number of LPDs on the film surface of the epitaxial film is reduced can be easily obtained.

Detailed Embodiment of the Present Disclosure

With reference to the drawings, an embodiment of the present disclosure will be described in detail below. In the present specification, the notation of the form "A to B" means an upper limit and a lower limit of the range (that is, greater than or equal to A and less than or equal to B), and when the unit is not described in A while the unit is described only in B, the unit of A and the unit of B are the same. Furthermore, when an atomic ratio is not particularly limited while a compound or the like is represented by a chemical formula in the present specification, all the conventionally known atomic ratios are included, and the atomic ratio is not necessarily limited only to a stoichiometric range. For example, when it is described as "AlGaAs", the atomic ratio constituting AlGaAs is not limited to Al:Ga:As=0.5:0.5:1, but any conventionally known atomic ratio is included. The same applies to the description of compounds other than "AlGaAs".

[Gallium Arsenide Single Crystal Substrate]

The gallium arsenide single crystal substrate (hereinafter, also referred to as a "GaAs single crystal substrate") of the embodiment is a GaAs single crystal substrate having a main surface. At this point, the main surface is a surface on which an epitaxial film is formed. The ratio of the number of As atoms existing as the diarsenic trioxide to the number of As atoms existing as the diarsenic pentoxide is greater than or equal to 2 when the main surface is measured by the X-ray photoelectron spectroscopy using the X-ray having the energy of 150 eV and setting the take-off angle of the photoelectrons to 5°. Arithmetic average roughness Ra of the main surface is less than or equal to 0.3 nm. In the GaAs single crystal substrate having such the characteristic, smoothness of the main surface is enhanced. Furthermore, the diarsenic trioxide is more easily decomposed by heat treatment than the diarsenic pentoxide. Therefore, in the heating treatment when the epitaxial film is formed, the As oxide existing on the main surface of the gallium arsenide single crystal substrate is uniformly removed, and the main surface of the gallium arsenide single crystal substrate is further smoothed. As a result, when the epitaxial film is formed on the main surface, the number of LPDs on the film surface of the epitaxial film can be reduced.

While developing the GaAs single crystal substrate capable of forming the epitaxial film in which the number of LPDs is reduced, the present inventors have paid attention to the X-ray photoelectron spectroscopy (XPS) using the synchrotron radiation capable of more accurately analyzing the state of the main surface in the GaAs single crystal substrate as compared with the related art. Specifically, the cause of degradation of the main surface smoothness of the GaAs single crystal substrate was specified by performing the X-ray photoelectron spectroscopy, and attainment of the GaAs single crystal substrate capable of forming the epitaxial film in which the number of LPDs was reduced by eliminating the above cause was attempted. At this point, the X-ray photoelectron spectroscopy refers to an analysis method in which a sample is irradiated with the X-ray and a distribution of kinetic energy of photoelectrons emitted from the sample is measured to obtain knowledge about a kind, an abundance, a chemical bonding state, and the like of elements existing on the surface of the sample.

Conventionally, when the main surface of the GaAs single crystal substrate was measured by the X-ray photoelectron spectroscopy, the X-ray photoelectron spectroscopy was performed using the X-ray (hard X-ray) in which the energy was fixed at around 1.5 keV. For example, "Yukihiro Hirota et al., "Clean and Damage-Free GaAs Surface Prepared by Using the Ultrasonic Running Deionized Water Treatment", Surface Science, 1991, Vol. 12, No. 6, pp. 380 to 392" (NPL 2) and "Teruo Tsunoda, "Cleaning Technology of Electronic Materials", Journal of Japan Oil Chemists' Society, 1986, Vol. 35, No. 10, pp. 867 to 872" (NPL 3) disclose the X-ray photoelectron spectroscopy using an X-ray source of 1253.6 eV. In the case of using the X-ray fixed in the vicinity of 1.5 keV, the knowledge on the state of the main surface of the GaAs single crystal substrate was obtained as the state in which the region from the main surface of the GaAs single crystal substrate to the depth of 5 nm was averaged. The region corresponds to about 20 atomic layers in terms of atomic layers. For this reason, in the conventional X-ray photoelectron spectroscopy, it is difficult to accurately analyze the state of the main surface of the GaAs single crystal substrate.

On the other hand, in the present disclosure, the main surface of the GaAs single crystal substrate is measured by the X-ray photoelectron spectroscopy under the condition that the X-ray (soft X-ray) having the energy of 150 eV is used and the photoelectron take-off angle is set to 5° (hereinafter, also referred to as a "specific condition"). The extreme surface of the main surface of the GaAs single crystal substrate can be analyzed using the low-energy soft X-ray and detecting the photoelectrons having the low take-off angle. Specifically, the region having the depth of 0.15 nm of the main surface of the GaAs single crystal substrate can be analyzed under the above specific condition. The region corresponds to about one atomic layer in terms of an atomic layer, and thus the state of the main surface of the GaAs single crystal substrate can be analyzed with higher accuracy as compared with the related art.

As illustrated in Examples (Samples 1 to 3) described later, when the main surface of the GaAs single crystal substrate of the embodiment is measured by the X-ray photoelectron spectroscopy under the above specific condition, the ratio of the number of As atoms existing as the diarsenic trioxide to the number of As atoms existing as the diarsenic pentoxide is greater than or equal to 2. Arithmetic average roughness Ra of the main surface is less than or equal to 0.3 nm. The number of As atoms existing as the diarsenic trioxide and the number of As atoms existing as the diarsenic pentoxide are calculated from an As3d spectrum obtained by the measurement using the X-ray photoelectron spectroscopy as described later. In the case where the epitaxial film is grown on the main surface of such the GaAs single crystal substrate, the number of LPDs having the diameter greater than or equal to 18 μm when converted into a circular shape with an equal area is less than 4 per 1 cm$^2$ of the film surface of the epitaxial film. In the present specification, the "film surface" of the epitaxial film refers to a surface on a side opposite to a side of the gallium arsenide single crystal substrate in the epitaxial film.

On the other hand, as illustrated in comparative examples (Samples 4 to 7) described later, when the main surface of the conventional GaAs single crystal substrate is measured by the X-ray photoelectron spectroscopy under the above specific condition, the ratio of the number of As atoms existing as the diarsenic trioxide to the number of As atoms existing as the diarsenic pentoxide is less than 2. In the case where the epitaxial film is grown on the main surface of such the GaAs single crystal substrate, the number of LPDs having the diameter greater than or equal to 18 μm when converted into a circular shape with an equal area exceeds 4 per 1 cm$^2$ of the film surface of the epitaxial film.

As described above, the present inventors have found for the first time that the number of LPDs on the film surface of the epitaxial film formed on the main surface of the GaAs single crystal substrate depends on the ratio of the number of As atoms existing as the diarsenic trioxide to the number of As atoms existing as the diarsenic pentoxide on the extreme surface of the main surface. Hereinafter, the ratio of the number of As atoms existing as the diarsenic trioxide to the number of As atoms existing as the diarsenic pentoxide is also referred to as "ratio As(3+)/As(5+)".

In the gallium arsenide single crystal, arsenic can be deposited at the crystal grain boundary. The size of the deposited arsenic is usually on the order of submicron. In the gallium arsenide single crystal, oxidation easily proceeds at a position where arsenic is deposited, and the gallium arsenide single crystal is oxidized deeper. In such the position, the amount of diarsenic pentoxide increases. In the case where the GaAs single crystal substrate is prepared from the gallium arsenide single crystal containing the deposited arsenic, even when the etching treatment removing the oxide film is performed on the main surface of the GaAs single crystal substrate, a part of the oxide film remains. For this reason, it is presumed that in the GaAs single crystal substrate having a large number of As atoms existing as the diarsenic pentoxide on the extreme surface of the main surface, that many oxide films remain on the extreme surface of the main surface, and that the smoothness of the main surface is low.

On the other hand, on the extreme surface of the main surface of the GaAs single crystal substrate of to the embodiment, the ratio As(3+)/As(5+) is greater than or equal to 2. Thus, in the GaAs single crystal substrate of the embodiment, the oxide film caused by the arsenic deposited between the crystal grains is less likely to remain, and the smoothness of the main surface is improved. Thus, when the epitaxial film is formed on the main surface, the number of LPDs on the film surface of the epitaxial film can be reduced.

Furthermore, the diarsenic trioxide is more easily decomposed by the heat treatment than the diarsenic pentoxide. Accordingly, in the GaAs single crystal substrate in which the ratio As(3+)/As(5+) on the extreme surface of the main surface is greater than or equal to 2, the arsenic oxide existing on the main surface is uniformly removed by the heating treatment when the epitaxial film is formed, and the main surface of the gallium arsenide single crystal substrate is further smoothed. As a result, when the epitaxial film is formed on the main surface, the number of LPDs on the film surface of the epitaxial film can be reduced.

The ratio As(3+)/As(5+) does not need to be greater than or equal to 2 at all points of the main surface of the GaAs single crystal substrate. The average value of the ratios As(3+)/As(5+) at a plurality of points on the main surface of the GaAs single crystal substrate may be greater than or equal to 2.

The upper limit of the ratio As(3+)/As(5+) when the main surface of the GaAs single crystal substrate is measured by the X-ray photoelectron spectroscopy under the above specific conditions should not be particularly limited, but may be ideally infinite.

For example, the GaAs single crystal substrate of the embodiment can be obtained by executing a method for producing a GaAs single crystal substrate described later.

When the main surface of the GaAs single crystal substrate of the embodiment is measured by the X-ray photoelectron spectroscopy under the above specific conditions, the ratio As(3+)/As(5+) is preferably greater than or equal to 5. Thus, the GaAs single crystal substrate can further reduce the number of LPDs on the film surface of the epitaxial film.

<Analysis of Main Surface of GaAs Single Crystal Substrate Using X-Ray Photoelectron Spectroscopy>

(Analysis System)

FIG. 1 is a view schematically illustrating a configuration of an analysis system using the X-ray photoelectron spectroscopy. As illustrated in FIG. 1, an analysis system 100 includes an X-ray generation facility 10, a vacuum vessel 20, and an electron spectrometer 30. X-ray generation facility 10, vacuum vessel 20, and electron spectrometer 30 are connected in this order. Internal spaces of X-ray generation facility 10, vacuum vessel 20, and electron spectrometer 30 are maintained at ultra-high vacuum. For example, pressure in the internal spaces of X-ray generation facility 10, vacuum vessel 20, and electron spectrometer 30 is $4 \times 10^{-7}$ Pa.

X-ray generation facility 10 generates the X-ray called synchrotron radiation. For example, a beamline "BL17" in Kyushu Synchrotron Light Research Center, Saga Prefecture can be used as X-ray generation facility 10.

X-ray generation facility 10 generates the X-ray having energy of 150 eV, and irradiates a GaAs single crystal substrate 1 installed in vacuum vessel 20 with the X-ray. X-ray generation facility 10 in FIG. 1 includes an X-ray source 11, slits 12, 14, and a grating 13. Slits 12, 14 are disposed on an upstream side and a downstream side of the grating (spectrometer) 13, respectively. For example, slits 12, 14 are 4-quadrant slits.

X-ray source 11 outputs the synchrotron radiation (X-ray) radiated in a direction along a tangent of a traveling direction by bending the traveling direction of high-energy electrons in the circular accelerator by a magnetic field of a bending electromagnet.

The X-ray emitted from X-ray source 11 has high luminance. Specifically, the number of photons of the X-ray emitted from X-ray source 11 in 1 second is $10^9$ photons/s. However, the luminance (intensity) of the X-ray emitted from X-ray source 11 attenuates with time. For example, the luminance of the X-ray emitted after lapse of 11 hours since the activation of X-ray source 11 is ⅓ of the luminance of the X-ray emitted immediately after the activation.

The X-ray emitted from X-ray source 11 is collimated by a collimating mirror (not illustrated) or the like. Slit 12 allows part of the collimated X-ray to pass therethrough. The X-ray passing through slit 12 is monochromatized by grating 13. Slit 14 limits spread of the monochromatized X-ray.

The energy of the X-ray emitted from X-ray generation facility 10 is determined by slit widths of slits 12, 14 and engraving density of grating 13. For example, the slit widths of slits 12, 14 are set to 30 μm, grating 13 having a central engraved density of 400 U/mm is used, and an emission angle of the grating is adjusted, so that X-ray of 150±0.05 eV is emitted from X-ray generation facility 10.

When GaAs single crystal substrate 1 installed in vacuum vessel 20 is irradiated with the X-ray from X-ray generation facility 10, photoelectrons are emitted from GaAs single crystal substrate 1.

Electron spectrometer 30 measures a kinetic energy distribution of photoelectrons emitted from GaAs single crystal substrate 1. Electron spectrometer 30 includes a hemispherical analyzer and a detector. The hemispherical analyzer disperses photoelectrons. The detector counts the number of photoelectrons for each energy.

An angle θ1 formed between the traveling direction of the X-ray incident on GaAs single crystal substrate 1 from X-ray generation facility 10 and a main surface 1m of GaAs single crystal substrate 1 is variable. In addition, an angle (hereinafter, also referred to as a "take-off angle θ2") formed between a traveling direction of photoelectrons captured by electron spectrometer 30 among photoelectrons emitted from GaAs single crystal substrate 1 and main surface 1m of GaAs single crystal substrate 1 is also variable. In the embodiment, take-off angle θ2 is set to 5°. Angle θ1 is not particularly limited, but for example, is set to 85°.

For example, a high-resolution XPS analyzer "R3000" produced by Scienta Omicron can be used as electron spectrometer 30.

(Depth of Extreme Surface to be Analyzed)

Photoelectrons generated in GaAs single crystal substrate 1 by X-ray irradiation easily lose energy due to inelastic scattering. Accordingly, only a part of the photoelectrons generated in GaAs single crystal substrate 1 escapes into vacuum while maintaining the generated energy and reach electron spectrometer 30. The photoelectrons escaping from the surface are generated at a depth corresponding to about three times an inelastic mean free path (IMFP) of the photoelectrons. Consequently, the surface depth d (nm) to be analyzed is expressed by the following [Mathematical Formula 1]. In [Mathematical Formula 1], λ (nm) is an IMFP value, and θ2 is the take-off angle.

$$d = 3\lambda \sin\theta_2 \quad \text{[Mathematical Formula 1]}$$

As described in "Method for Estimating Inelastic Mean Free Path of Electron by Tpp-2M", Journal of Surface Analysis, Vol. 1, No. 2, 1995 (NPL 1), λ (Å) is expressed by the following [Mathematical Formula 2].

$$\lambda = \frac{E}{E_p^2[\beta\ln(\gamma E) - C/E + D/E^2]} \quad \text{[Mathematical Formula 2]}$$

$$E_p = 28.8\left(\frac{N_v\rho}{A_w}\right)^{1/2}$$

$$\beta = -0.10 + \frac{0.944}{(E_p^2 + E_g^2)^{\frac{1}{2}}} + 0.069\rho^{0.1}$$

$$\gamma = 0.191\rho^{-0.50}$$

$$C = 1.97 - 0.94U$$

$$D = 53.4 - 20.8U$$

$$U = \frac{N_v\rho}{A_w} = \frac{E_p^2}{829.4}$$

In [Mathematical Formula 2], $A_W$ represents an atomic weight or a molecular weight, $N_v$ represents the number of valence electrons per atom or molecule, $E_p$ represents plasmon energy (eV) of free electrons, ρ represents density (g/cm³), and $E_g$ represents band gap energy (eV). In addition, E represents kinetic energy (eV) of the photoelectrons, and is calculated from energy (eV) of the X-ray to be emitted and binding energy (eV) between an electron and an atomic nucleus.

Surface depth d (nm) is calculated using [Mathematical Formula 1] and [Mathematical Formula 2]. λ (Å) calculated using [Mathematical Formula 2] is converted into a unit "nm" and then substituted into [Mathematical Formula 1]. Surface depth d calculated using [Mathematical Formula 1] and [Mathematical Formula 2], various parameter values regarding the 3d electron of the As atom in diarsenic pentoxide and the diarsenic trioxide, and the X-ray energy of 150 eV is about 0.15 nm. That is, when main surface 1m of GaAs single crystal substrate 1 is measured by the X-ray photoelectron spectroscopy under the above specific condition, the state of atoms existing in the region of the depth of 0.15 nm of the main surface is analyzed.

(Method for Calculating Ratio of Number of as Atoms Existing as the Diarsenic Trioxide to Number of as Atoms Existing as the Diarsenic Pentoxide)

Hereinafter, a method for calculating the ratio of the number of As atoms existing as the diarsenic trioxide to the number of As atoms existing as the diarsenic pentoxide on the extreme surface of the GaAs single crystal substrate using the X-ray photoelectron spectroscopy in which the synchrotron radiation is used as the X-ray source will be described with reference to FIG. 2.

The surface of the main surface of the GaAs single crystal substrate is analyzed according to the X-ray photoelectron spectroscopy using the X-ray having the energy of 150 eV. The kinetic energy distribution of the photoelectrons emitted from the GaAs single crystal substrate is obtained by performing the analysis.

Kinetic energy E of the photoelectrons emitted from the GaAs single crystal substrate is expressed by the following equation using energy hν (eV) of the irradiated X-ray, binding energy $E_B$ (eV) of electrons in the GaAs single crystal substrate, and a work function φ (eV).

$$E = h\nu - E_B - \varphi$$

A spectrum indicating the binding energy distribution of electrons is generated from the kinetic energy distribution of the photoelectrons emitted from the GaAs single crystal substrate using the above equation. In the embodiment, the As3d spectrum indicating the binding energy distribution of electrons emitted from a 3d orbital of the As atom existing on the extreme surface of the main surface of the GaAs single crystal substrate is generated. At this point, in the present specification, the "As3d spectrum" refers to a spectrum representing the signal intensity of the photoelectrons emitted from the 3d orbits of the As atoms (the As atoms contained in As oxide and GaAs).

Furthermore, in the analysis according to the X-ray photoelectron spectroscopy, the As3d spectrum is preferable obtained by performing narrow scan in a predetermined binding energy range from the viewpoint of accurate measurement. Specifically, by performing the narrow scan in the range where the binding energy is 37 eV to 52 eV, the As3d spectrum can be represented in a graph in which the above range is taken as a horizontal axis and the signal intensity is taken as the vertical axis.

The narrow scan is performed under the condition that the energy interval is 0.02 eV, the integration time at each energy value is 100 ms, and the number of integrations is 50. Energy resolution E/ΔE is 3480.

On the extreme surface of the main surface of the GaAs single crystal substrate, the As atom (that is, the As atom bonded to Ga) existing as GaAs, the As atom existing as the diarsenic trioxide, and the As atom existing as the diarsenic pentoxide may exist.

The binding energies of 3d orbital electrons of these As atoms are different from each other. Furthermore, the electron having the binding energy corresponding to an upward spin and the electron having the binding energy corresponding to a downward spin exist in the 3d orbit of the As atom existing as GaAs.

The binding energy of the 3d orbital electron of the As atom existing as the diarsenic pentoxide is about 45.8 eV. The binding energy of the 3d orbital electron of the As atom existing as the diarsenic trioxide is about 44.5 eV. The binding energies of two 3d orbital electrons with different spin directions in the As atom existing as GaAs are about 41.8 eV and about 41.0 eV. As described above, the As atoms existing on the extreme surface of the main surface of the GaAs single crystal substrate may have the 3d orbital electron having four different binding energies.

Accordingly, the following analysis is performed on the As3d spectrum using spreadsheet software "Excel" (registered trademark) version 2016 produced by Microsoft Corporation.

First, for the region of the As3d spectrum excluding the range of 41 eV to 47 eV, an approximate straight line is obtained by a least squares method, and the approximate straight line is determined as a baseline. The difference between the As3d spectrum and the baseline is determined as the base-corrected As3d spectrum.

Figure 2:
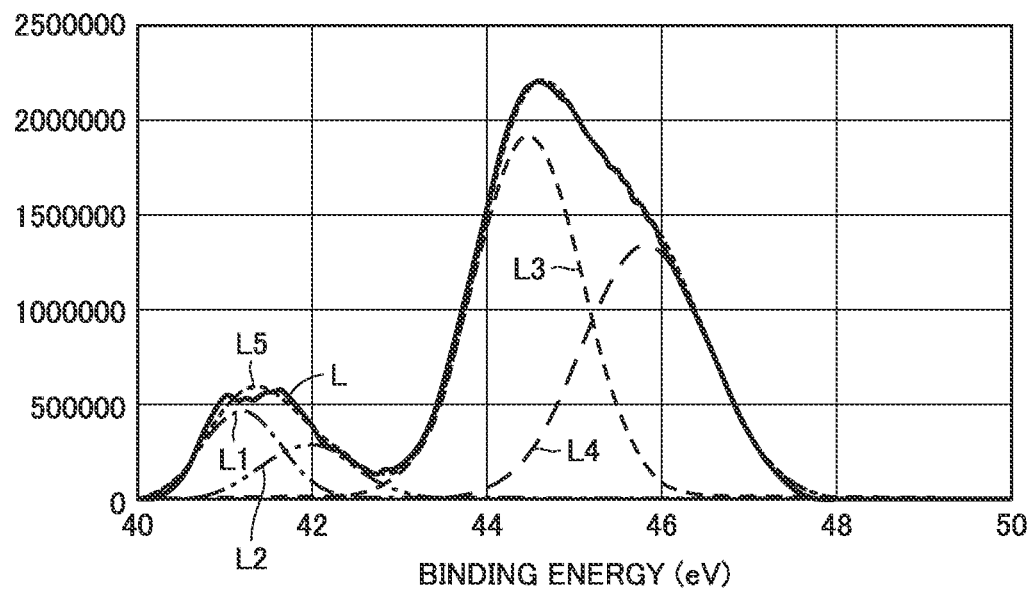
FIG. 2 is a graph illustrating an example of an As3d spectrum after base correction.

FIG. 2 is a graph illustrating an example of the base-corrected As3d spectrum. FIG. 2 illustrates a solid line L corresponding to the base-corrected As3d spectrum.

As described above, the As atom existing on the extreme surface of the main surface of the GaAs single crystal substrate may have the 3d orbital electron having four different binding energies. For this reason, the following four Gaussian functions Y1, Y2, Y3, Y4 are prepared.

$$Y1 = a1 * \exp\{(-(X-b1)^2)/c1^2\}$$

$$Y2 = a2 * \exp\{(-(X-b2)^2)/c2^2\}$$

$$Y3 = a3 * \exp\{(-(X-b3)^2)/c3^2\}$$

$$Y4 = a4 * \exp\{(-(X-b4)^2)/c4^2\}$$

Gaussian functions Y1, Y2 indicate peak components corresponding to two 3d orbital electrons having different spin directions in the As atom existing as GaAs. Gaussian function Y3 indicates a peak component corresponding to the 3d orbital electron of the As atom existing as the diarsenic trioxide. Gaussian function Y4 indicates a peak component corresponding to the 3d orbital electron of the As atom present as the diarsenic pentoxide.

12 parameters of the variables a1, a2, a3, a4, b1, b2, b3, b4, c1, c2, c3, c4 are optimized using a solver such that the difference between the corrected As3d spectrum and a fitting function Y obtained by summing Gaussian functions Y1, Y2, Y3, Y4 at the binding energy of 37 eV to 52 eV is minimized.

Optimization of 12 parameters may be executed under the following constraint conditions.

Variables a1, a2, a3, a4 are greater than or equal to 1.
$40.5 \leq b1 \leq 41.5$
$41.5 \leq b2 \leq 42.2$
$44.3 \leq b3 \leq 44.7$
$45.7 \leq b4 \leq 45.9$
$0.2 \leq c1 \leq 0.95$
$0.2 \leq c2 \leq 0.95$
$0.2 \leq c3 \leq 0.95$
$0.2 \leq c4 \leq 1.2$ In FIG. 2, a one-dot chain line L1, a two-dot chain line L2, and broken lines L3, L4 correspond to optimized Gaussian functions Y1, Y2, Y3, Y4, respectively. A dotted line L5 corresponds to fitting function Y.

An area s3 between optimized Gaussian function Y3 and the horizontal axis (X-axis) corresponds to the number of photoelectrons emitted from the 3d orbital of the As atom existing as the diarsenic trioxide. Similarly, an area s4 between optimized Gaussian function Y4 and the horizontal axis (X-axis) corresponds to the number of photoelectrons emitted from the 3d orbital of the As atom existing as the diarsenic pentoxide. Accordingly, s3/s4 is calculated as the ratio (ratio As(3+)/As(5+)) of the number of As atoms existing as the diarsenic trioxide to the number of As atoms existing as the diarsenic pentoxide.

<Off Angle of GaAs Single Crystal Substrate>

The main surface of the GaAs single crystal substrate of the embodiment is preferably a surface having an off angle greater than or equal to 0.01° and less than or equal to 15° with respect to the (100) plane. When the main surface is the surface having the off angle greater than or equal to 0.01° and less than or equal to 15° with respect to the (100) plane, the epitaxial film in which the number of LPDs is reduced can be formed on a surface having an orientation excellent in the electrical characteristic and the optical characteristic in the GaAs single crystal substrate. Thus, the effect of reducing the number of LPDs can be effectively utilized in order to improve the device characteristic of the GaAs single crystal substrate. The main surface of the GaAs single crystal substrate is more preferably a surface having the off angle greater than or equal to 0.2° and less than or equal to 6° with respect to the (100) plane. The main surface of the GaAs single crystal substrate is most preferably a surface having the off angle of 2°±0.2° (1.8° to 2.2°) with respect to the (100) plane.

The off angle with respect to the (100) plane of the main surface of the GaAs single crystal substrate can be measured using a conventionally known single crystal orientation measuring apparatus (for example, trade name: "X'Pert PRO MRD", produced by Malvern Panalytical Ltd.).

<Shape of GaAs Single Crystal Substrate>

The GaAs single crystal substrate of the embodiment preferably has a disk shape having the diameter greater than or equal to 75 mm and less than or equal to 300 mm. That is, the present disclosure can provide the large GaAs single crystal substrate having the diameter greater than or equal to 75 mm and less than or equal to 300 mm. The GaAs single crystal substrate more preferably has the disk shape having the diameter greater than or equal to 100 mm and less than or equal to 300 mm. Furthermore, the GaAs single crystal substrate more preferably has the disk shape having the diameter greater than or equal to 150 mm and less than or equal to 300 mm. Furthermore, the GaAs single crystal substrate more preferably has the disk shape having the diameter greater than or equal to 150 mm and less than or equal to 200 mm. Thus, when the epitaxial film is formed on the surface of the main surface of the large GaAs single crystal substrate having the diameter greater than or equal to 75 mm, the number of LPDs on the film surface of the epitaxial film can be reduced.

At this point, in the present specification, it is assumed that the GaAs single crystal substrate having the "diameter of 75 mm" includes a 3-inch GaAs single crystal substrate. It is assumed that the GaAs single crystal substrate having the "diameter of 100 mm" includes a 4-inch GaAs single crystal substrate. Similarly, it is assumed that the GaAs single crystal substrate having the "diameter of 150 mm" includes a 6-inch GaAs single crystal substrate. It is assumed that the GaAs single crystal substrate having the "diameter of 200 mm" includes an 8-inch GaAs single crystal substrate. It is assumed that the GaAs single crystal substrate having the "diameter of 300 mm" includes a 12-inch GaAs single crystal substrate.

<Surface Roughness of GaAs Single Crystal Substrate>

Furthermore, in the GaAs single crystal substrate, surface roughness of the main surface of the substrate represented by arithmetic average roughness Ra is preferably less than or equal to 0.3 nm. Thus, the surface smoothness of the main surface of the GaAs single crystal substrate can be further improved, so that the epitaxial film in which the number of LPDs is further reduced can be formed. Arithmetic average roughness Ra of the main surface of the GaAs single crystal substrate is more preferably less than or equal to 0.2 nm, and still more preferably less than or equal to 0.1 nm.

Arithmetic average roughness Ra does not need to be less than or equal to 0.3 nm at all points of the main surface of the GaAs single crystal substrate. The average value of arithmetic average roughness Ra at a plurality of points on the main surface of the GaAs single crystal substrate may be less than or equal to 0.3 nm.

The arithmetic average roughness (Ra) of the GaAs single crystal substrate can be measured using a conventionally known surface roughness measurement apparatus (for example, trade name: "Dimension Edge", produced by Bruker Corporation).

<Defect Density of Main Surface of GaAs Single-Crystal Substrate>

When the GaAs single crystal substrate is semi-insulating, the defect density of the main surface of the GaAs single crystal substrate is preferably less than or equal to 6000/cm$^2$. The electrical resistivity (also referred to as specific resistance) of the semi-insulating GaAs single crystal substrate is greater than or equal to $8 \times 10^7$ Ωcm.

When the GaAs single crystal substrate is conductive, the defect density of the main surface of the GaAs single crystal substrate is preferably less than or equal to 1000/cm$^2$. The electrical resistivity (also referred to as specific resistance) of the conductive GaAs single crystal substrate is less than or equal to $15 \times 10^{-3}$ Ωcm.

The defect density is the density of dislocation defects, and for example, is measured by generating etch pits and then observing the surface thereof using an optical microscope. The etch pit is a corrosion hole in the surface that appears when the crystal surface is treated with chemicals. The corrosion hole corresponds to a point where dislocation that is a linear lattice defect of crystal crosses the crystal surface. Consequently, the defect density can be measured by calculating the number of etch pits.

A method for calculating the number of etch pits formed on the main surface of the GaAs single crystal substrate will be described. First, the surface of the GaAs single crystal substrate is immersed in molten potassium hydroxide at 500° C. for 10 minutes. A conventionally known method can be used as the immersion method. Subsequently, the GaAs single crystal substrate is taken out from the molten potassium hydroxide, and a circular region on the main surface (for example, a {100} just surface) is observed with a known optical microscope (for example, trade name: "ECLIPSE (registered trademark) LV150N", produced by Nikon Corporation) at a magnification of 100 times (one visual field has a size of 1 mm square, namely, a size of 1 mm×1 mm), thereby counting the number of etch pits in one visual field. In this case, the number of etch pits is calculated for all the circular regions by setting the field of view without overlap by moving the GaAs single crystal substrate or the like and setting the visual field completely. At this point, in the case where a boundary (inside and outside) of the circular region appears in one visual field, when the etch pit exists even outside the circular region only in the visual field, this is counted.

<Uniformity of Main Surface of GaAs Single Crystal Substrate>

The ratio As(3+)/As(5+) is preferably uniform on the main surface of the GaAs single crystal substrate of the embodiment. For example, the standard deviation of the ratio As(3+)/As(5+) when nine measurement points on the main surface are measured by the X-ray photoelectron spectroscopy is preferably less than or equal to 1.

A method for calculating the average value of arithmetic average roughness Ra on the main surface of the GaAs single crystal substrate will be described. An atomic force microscope (AFM) is used to measure arithmetic average roughness Ra. The shape of a region where one measurement is performed is a square. A dimension of one side of the square is 1 μm. The position of the measurement point on the main surface is the center of the square, namely, the center of gravity. Arithmetic average roughness Ra is measured for each of the nine measurement points on the main surface. The average value of arithmetic average roughness Ra is calculated by dividing a sum of the measured nine values of arithmetic average roughness Ra by 9. The average value of arithmetic average roughness Ra is preferably less than or equal to 0.3 nm.

The nine measurement points are previously set such that the distance between the measurement points is as large as possible. For example, when the GaAs single crystal substrate having the diameter greater than or equal to 75 mm and less than or equal to 300 mm, the nine measurement points are set as follows.

In order to evaluate the effect of preventing the generation of the LPD of the epitaxial film due to the improvement of the uniformity of the ratio As(3+)/As(5+) on the main surface of the GaAs single crystal substrate, preferably the LPD generated in the epitaxial film grown in the vicinity region of each of the nine measurement points is measured. The number of LPDs having the diameter greater than or equal to 18 μm per 1 cm$^2$ of the film surface of the epitaxial film grown on the main surface of the GaAs single crystal substrate is preferably measured for the region having the diameter greater than or equal to 30 mm. Accordingly, on the main surface of the GaAs single crystal substrate, the positions of nine circular measurement regions having the diameter of 30 mm are set such that the distance between the measurement regions is as large as possible. Then, the center of each measurement region is set as the measurement point.

When the diameter of the GaAs single crystal substrate is D mm ($75 \leq D \leq 300$) and when two axes passing through the center of the main surface and orthogonal to each other on the main surface are the X-axis and the Y-axis, the coordinate (X, Y) of the X-axis and the Y-axis of the first measurement point among the nine measurement points is set to (0, 0). The X-axis and the-Y axis are set such that the notch formed in the GaAs single crystal substrate is located in the third quadrant of an XY-coordinate plane and such that a general angle of a half line passing through the notch with respect to the half line extending in the positive direction of the X-axis from the origin becomes 225°.

Furthermore, the second measurement point, the third measurement point, the fourth measurement point, and the fifth measurement point in the nine measurement points are arranged at equal intervals on a circumference of a radius D/4.

That is, the coordinate (X, Y) of the n-th measurement point (n is any one of 2, 3, 4, 5) is set to {(D/4)×cos(90×(n−2)), (D/4)×sin(90×(n−2))}. Specifically, the coordinate (X, Y) of the second measurement point is set to (D/4,0). The coordinate (X, Y) of the third measurement point is set to (0,D/4). The coordinate (X, Y) of the fourth measurement point is set to (−D/4,0). The coordinate (X, Y) of the fifth measurement point is set to (0,−D/4).

In general, edge roll-off is generated near the outer periphery of the disk-shaped GaAs single crystal substrate. Edge roll-off is degradation of flatness generated in a polishing process during producing. In consideration of the edge roll-off, four measurement regions centered on the remaining sixth measurement point, the seventh measurement point, the eighth measurement point, and the ninth measurement point are set so as to be inscribed in the circumference on the inside by 5 mm from the outer periphery of the GaAs single crystal substrate. Because the diameter of each measurement region is 30 mm, the sixth measurement point, the seventh measurement point, the eighth measurement point, and the ninth measurement point are arranged at equal intervals on the circumference of the radius (D−10−30)/2. However, the half line passing through the sixth measurement point, the seventh measurement point, the eighth measurement point, and the ninth measurement point and having the origin as the end point is shifted by 45° with respect to the half line passing through the second measurement point, the third measurement point, the fourth measurement point, and the fifth measurement point and having the origin as the end point.

That is, the coordinate (X, Y) of the n-th measurement point (n is any one of 6, 7, 8, 9) is set to [{(D−40)/2}×cos{45+90×(n−6)},{(D−40)/2}×sin{45+90×(n−6)}}]. Specifically, the coordinate (X, Y) of the sixth measurement point is set to {(D−40)/8½, (D−40)/8$^{1/2}$}. The coordinate (X, Y) of the seventh measurement point is set to {−(D−40)/8$^{1/2}$, (D−40)/8$^{1/2}$}. The coordinate (X, Y) of the eighth measurement point is set to {−(D−40)/8$^{1/2}$,−(D−40)/8$^{1/2}$}. The coordinate (X, Y) of the ninth measurement point is set to {(D−40)/8$^{1/2}$, −(D−40)/8$^{1/2}$}.

Figure 5:
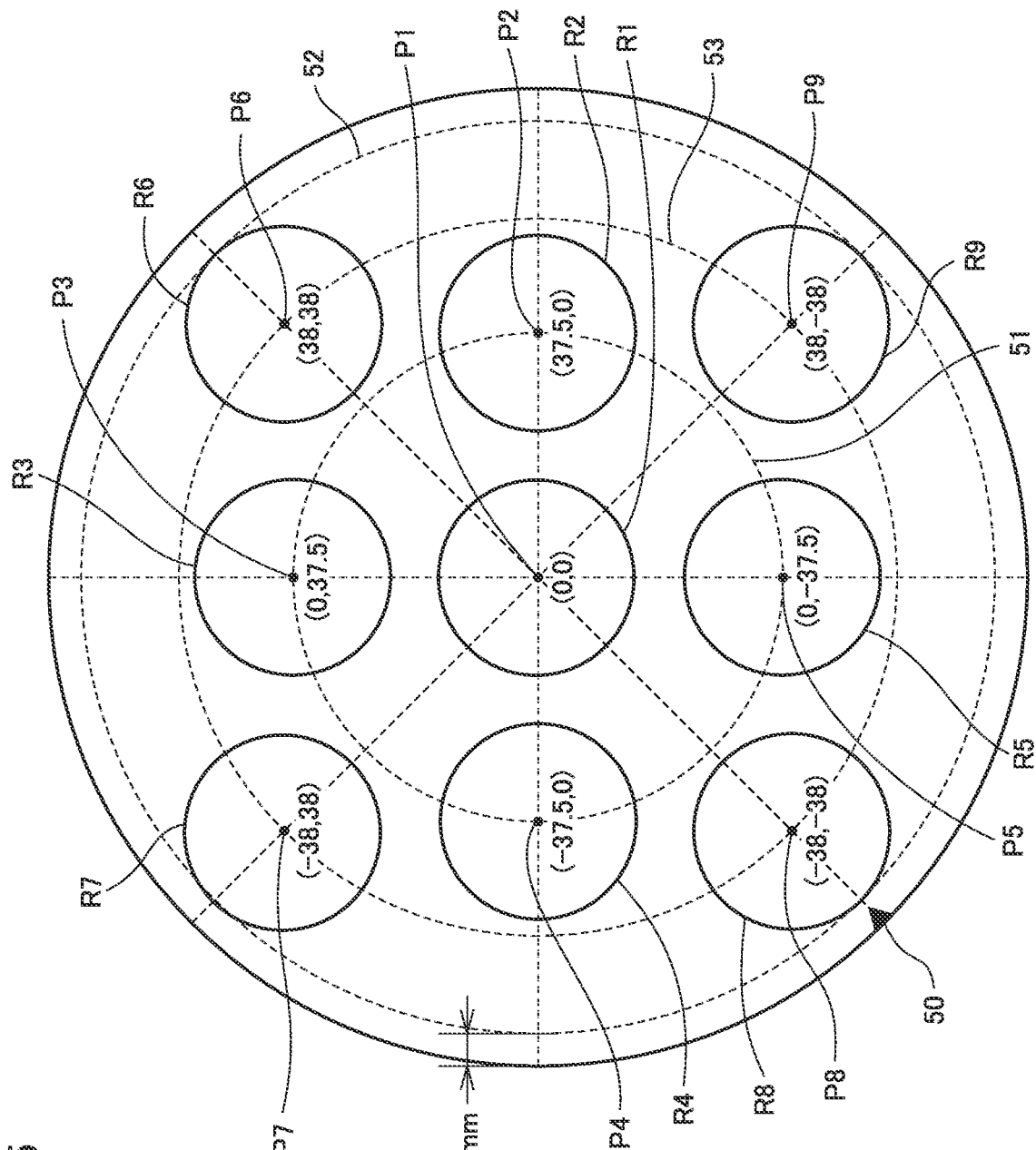
FIG. 5 is a view illustrating nine measurement points set to a GaAs single crystal substrate having a diameter of 150 mm.
Figure 6:
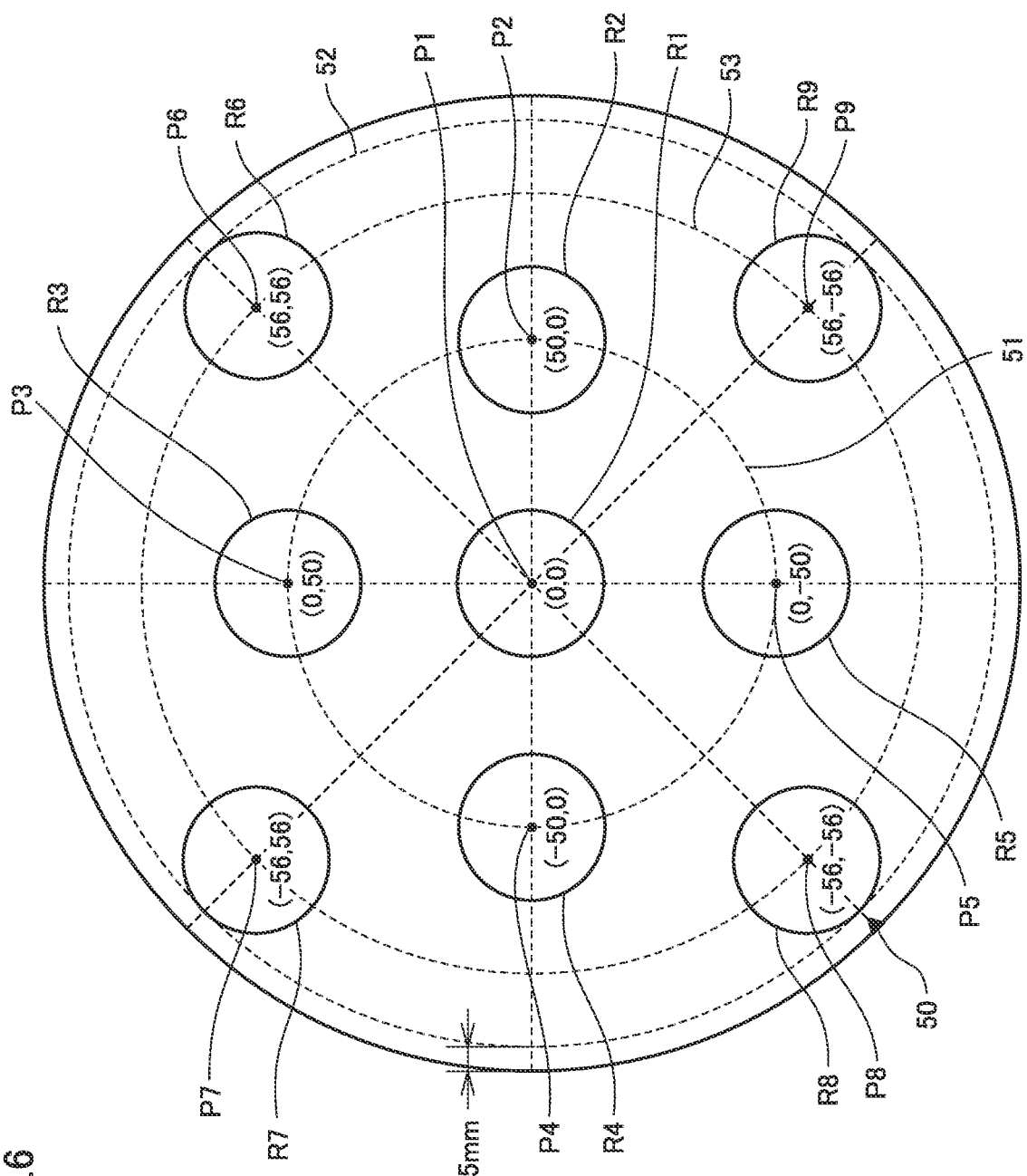
FIG. 6 is a view illustrating nine measurement points set on the GaAs single crystal substrate having the diameter of 200 mm.

FIG. 5 is a view illustrating nine measurement points set on the GaAs single crystal substrate having the diameter of 150 mm. FIG. 6 is a view illustrating nine measurement points set on the GaAs single crystal substrate having the diameter of 200 mm.

As illustrated in FIGS. 5 and 6, the X-axis and the Y-axis are set such that the general angle of the half line passing through a notch 50 with respect to the half line extending in the positive direction of the X-axis from the origin is set to 225°. Then, a first measurement point P1 is set at the origin (0, 0) that is the center of the GaAs single crystal substrate. Measurement region R1 is a region that is centered on first measurement point P1 and is in the circle having the diameter of 30 mm.

Subsequently, second measurement point P2, a third measurement point P3, a fourth measurement point P4, and a fifth measurement point P5 are set on a circumference 51 having the radius D/4. Measurement regions R1, R2, R3, R4 are regions centered on second measurement point P2, third measurement point P3, fourth measurement point P4, and fifth measurement point P5, respectively and are in the circle having the diameter of 30 mm.

In the example of FIG. 5, coordinates (X, Y) of the second measurement point P2, third measurement point P3, fourth measurement point P4, and fifth measurement point P5 (the units of X, Y are both mm. the same applies hereinafter) are set to (37.5, 0), (0, 37.5), (−37.5, 0), and (0, −37.5), respectively. In the example of FIG. 6, the coordinates (X, Y) of second measurement point P2, third measurement point P3, fourth measurement point P4, and fifth measurement point P5 are set to (50, 0), (0, 50), (−50, 0), and (0, −50), respectively.

Subsequently, the centers of four measurement regions R6, R7, R8, R9 inscribed in a circumference 52 located inside by 5 mm from the outer circumference are set as a sixth measurement point P6, a seventh measurement point P7, an eighth measurement point P8, and a ninth measurement point P9, respectively. The diameter of each of measurement regions R6, R7, R8, R9 is 30 mm. Consequently, sixth measurement point P6, seventh measurement point P7, eighth measurement point P8, and ninth measurement point P9 are set on a circumference 53 of the radius (D−10−30)/2.

In the example of FIG. 5, the coordinates (X, Y) of sixth measurement point P6, seventh measurement point P7, eighth measurement point P8, and ninth measurement point P9 are set to (38,38), (−38,38), (−38,−38), and (38,−38), respectively. In the example of FIG. 6, the coordinates (X, Y) of sixth measurement point P6, seventh measurement point P7, eighth measurement point P8, and ninth measurement point P9 are set to (56,56), (−56,56), (−56,−56), and (56,−56), respectively.

[Epitaxial Substrate]

An epitaxial substrate is prepared by forming the epitaxial film on the main surface of the gallium arsenide single crystal substrate (GaAs single crystal substrate). The epitaxial film is a compound film made of Al y is greater than or equal to 0 and less than or equal to 1, the z is greater than or equal to 0 and less than or equal to 1, and the sum of the y and the z is more preferably greater than or equal to 0 and less than or equal to 1. That is, in the present disclosure, a compound film made of $Al_{1-y-z}Ga_yIn_zAs$ ($0 \le y \le 1$, $0 \le z \le 1$, $0 \le y+z \le 1$) can be applied to the epitaxial film formed on the main surface of the GaAs single crystal substrate.

For example, the epitaxial film is formed to have the thickness of 0.5 μm to 10 μm. When the thickness of the epitaxial film falls within the above-mentioned range, the epitaxial substrate can be applied to a wide range of applications. The epitaxial film more preferably has the thickness of 1 μm to 5 μm.

[Method for Producing Gallium Arsenide Single Crystal Substrate]

A method for producing the gallium arsenide single crystal substrate (GaAs single crystal substrate) of the embodiment includes: a process (hereinafter, referred to as an "oxidation process") of forming the oxide film on the main surface of the gallium arsenide single crystal substrate precursor using at least one of ozone gas and an ultraviolet ray while the gallium arsenide single crystal substrate precursor is heated under a heating condition greater than 100° C. and less than or equal to 200° C.; and a process (hereinafter, referred to as an "etching process") of bringing the main surface into contact with an acidic aqueous solution and etching the oxide film.

Because the method for producing the GaAs single crystal substrate includes the oxidation process and the etching process, when the epitaxial film is formed on the main surface of the GaAs single crystal substrate, the GaAs single crystal substrate in which the number of LPDs on the film surface of the epitaxial film is reduced can be obtained.

The heating condition is preferably greater than or equal to 150° C. and less than or equal to 200° C. Thus, when the epitaxial film is formed on the main surface of the GaAs single crystal substrate, the GaAs single crystal substrate in which the number of LPDs on the film surface of the epitaxial film is reduced can be easily obtained. At this point, in the present specification, the "Gallium arsenide single crystal substrate precursor (hereinafter, also referred to as a "GaAs single crystal substrate precursor")" refers to the GaAs single crystal substrate produced using a GaAs single crystal growth apparatus, and particularly refers to the GaAs single crystal substrate subjected to the oxidation process and the etching process.

The present inventors have intensively studied a producing method capable of obtaining the GaAs single crystal substrate in which the ratio As(3+)/As(5+) on the extreme surface of the main surface is greater than or equal to 2 based on the analysis using the X-ray photoelectron spectroscopy under the above-described specific condition. Among them, it has been found that, in a conventional process of producing the GaAs single crystal substrate from the GaAs single crystal substrate precursor, the oxidation easily proceeds at the position where the arsenic is deposited in the GaAs single crystal substrate precursor, and As oxide at the position cannot be sufficiently removed.

Based on this finding, the present inventors have paid attention to that not only the position where arsenic is deposited but also a position that is relatively difficult to oxidize are uniformly oxidized by oxidizing the main surface of the GaAs single crystal substrate precursor while heating the GaAs single crystal substrate precursor. Gallium is forcibly oxidized by heating. The gallium is below aluminum in the periodic table and has properties similar to aluminum. The aluminum adsorbs moisture and oxygen in the atmosphere on the surface, and the surface becomes a passive film. Internal oxidation is prevented by forming the passive film. When the main surface of the GaAs single crystal substrate precursor is oxidized at room temperature, such the passive film is not sufficiently formed, and the oxidation of the position where the arsenic is deposited further proceeds. As a result, the number of As atoms existing as the diarsenic pentoxide tends to increase. On the other hand, the main surface of the GaAs single crystal substrate precursor is oxidized while heated at 100° C. to 200° C., the gallium is forcibly oxidized, and the passivation film is uniformly formed. Thus, it is considered that the main surface of the GaAs single crystal substrate precursor is uniformly oxidized, and that the number of As atoms existing as the diarsenic pentoxide decreases. It is considered that when the heating temperature exceeds 200° C., oxidizing power is too strong, and the main surface of the GaAs single crystal substrate precursor cannot be uniformly oxidized.

The GaAs single crystal substrate precursor in which the main surface is uniformly oxidized as described above is brought into contact with the acidic aqueous solution to etch the oxide film, so that the GaAs single crystal substrate in which the ratio As(3+)/As(5+) on the extreme surface of the main surface is greater than or equal to 2 can be obtained.

Figure 3:
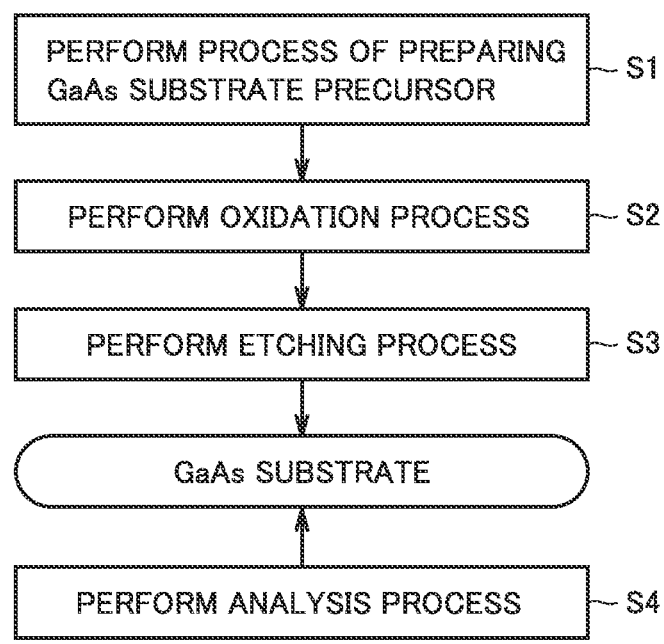
FIG. 3 is a flowchart illustrating a method for producing a GaAs single crystal substrate of an embodiment.

With reference to FIG. 3, each process included in the method for producing the GaAs single crystal substrate of the embodiment will be specifically described below. FIG. 3 is a flowchart illustrating a method for producing the GaAs single crystal substrate of the embodiment.

<GaAs Single-Crystal Substrate Precursor Preparation Process S1>

First, the method for producing the GaAs single crystal substrate preferably includes a GaAs single crystal substrate precursor preparation process S1. The GaAs single crystal substrate precursor preparation process S1 includes a processing process, a polishing process, a coarse cleaning process, and a precision cleaning process described below. However, these processes may be appropriately omitted according to the state of the GaAs single crystal substrate precursor.

(Processing Process)

The processing process is a process of processing the GaAs single crystal substrate precursor to a desired size (for example, the disk shape having the diameter of 6 inches and the thickness of 750 μm). A conventionally known method such as slicing or chamfering can be used as a processing method.

(Polishing Process)

The polishing process is a process of polishing the surface of the GaAs single crystal substrate precursor. Through the polishing process, the surface of the GaAs single crystal substrate precursor is mirror-finished, and the off angle of the main surface with respect to the (100) plane is adjusted. A conventionally known method can be used as the polishing method, and various polishing methods such as mechanical polishing and chemical polishing can be used.

(Coarse Cleaning Process)

The coarse cleaning process is a process of removing a polishing agent, a polishing liquid, and the like adhering to the polished GaAs single crystal substrate precursor. The coarse cleaning process includes cleaning with a wafer cleaning solution and cleaning with an ultrapure water rinse. At this point, the ultrapure water used for the ultrapure water rinse refers to water having electrical resistivity (specific resistance) greater than or equal to 18 MΩ·cm, total organic carbon (TOC) less than 10 μg/L (liter), and the number of fine particles less than 100 particles/L (liter). In addition, the cleaning with the wafer cleaning solution and the cleaning with the ultrapure water rinse may be repeated a plurality of times. At this point, the wafer cleaning solution is not particularly limited, but an aqueous tetramethylammonium hydroxide solution or the like is preferable from the viewpoint of a large cleaning effect.

(Precision Washing Process)

The precision washing process is a process including acid washing, the washing with the ultrapure water rinse, and drying. The cleaning liquid used for the acid cleaning is not particularly limited, but a nitric acid aqueous solution or the like is preferable from the viewpoint of the large cleaning effect. Because the ultrapure water used for the ultrapure water rinse is the same as the ultrapure water used for the ultrapure water rinse in the coarse cleaning process, the description will not be repeated. In addition, the drying method is not particularly limited, but a spin drying method, an isopropyl alcohol (IPA) vapor drying method, a hot air drying method, and the like are preferable from the viewpoint of suppressing adhesion of particles to the main surface.

Figure 4:
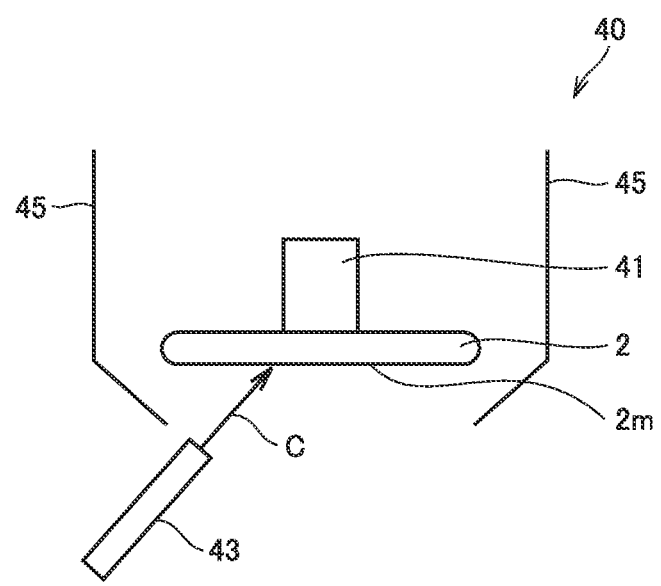
FIG. 4 is a view illustrating a cleaning apparatus according to a single wafer method.

Referring to FIG. 4, a single wafer method is preferable for the cleaning method in the precision cleaning process. FIG. 4 is a view illustrating a cleaning apparatus according to the single wafer method. In particular, a face down-single wafer method in which the cleaning is performed by the single wafer method with main surface 1m as the surface to be cleaned facing downward is more preferable. Specifically, using a cleaning apparatus 40 including a holder 41 holding a substrate, a cleaning solution tank 43 located below holder 41, and a chamber 45, a GaAs single crystal substrate precursor 2 is fixed to holder 41 while main surface 2m to be cleaned faces downward, and a cleaning liquid C is supplied from the lower side of main surface 2m to main surface 2m to be cleaned and cleaned while GaAs single crystal substrate precursor 2 is rotated by holder 41 and cleaning solution tank 43 is moved. According to such the cleaning method, because main surface 2m faces downward, adhesion of particles descending from above can be prevented, and particles adhering to main surface 2m fall due to gravity and do not adhere again, so that particles on main surface 2m can be significantly reduced. By such the cleaning method, particles having a particle size greater than or equal to 0.079 μm on main surface 2m of GaAs single crystal substrate precursor 2 can be set less than or equal to $1.0/cm^2$, preferably is less than or equal to $0.6/cm^2$.

<Oxidation Process S2>

In an oxidation process S2, the oxide film is formed on the main surface of the GaAs single crystal substrate precursor using at least one of the ozone gas and the ultraviolet ray while the GaAs single crystal substrate precursor is heated under a heating condition greater than or equal to 100° C. and less than or equal to 200° C. In the case of the oxidation using the ozone gas, a stage temperature is set greater than or equal to 100° C. and 200° C. using "Ozone Cleaner UV-1" produced by Samco Inc. In the case of the oxidation using the ultraviolet ray, the main surface of the GaAs single crystal substrate precursor is irradiated with the ultraviolet ray having a wavelength of 220 nm to 480 nm and an output of 20 $mW/cm^2$ to 40 $mW/cm^2$.

Japanese Patent Laying-Open No. 10-12577 (PTL 3) discloses forced oxidation of the surface of the GaAs mirror surface wafer using UV ozone. It is also known that UV ozone treatment is performed on a silicon wafer and a glass substrate.

When the silicon wafer is subjected to the UV ozone treatment, the surface is oxidized to form silicon dioxide. The silicon dioxide does not diffuse into the wafer. An electronic device is prepared using the characteristic of the silicon dioxide. In addition, there is no change even when the glass substrate that is an oxide is subjected to the UV ozone treatment to oxidize the surface. Accordingly, when the UV ozone treatment is performed on the silicon wafer and the glass substrate, diffusion into the inside is not required to be considered even when the silicon wafer and the glass substrate are heated.

On the other hand, in the GaAs single crystal substrate, the oxide film on the surface can diffuse into the inside. Accordingly, the UV ozone treatment on the surface of the GaAs mirror surface wafer as disclosed in PTL 3 has been performed at room temperature (without heating).

On the other hand, the present inventors have found for the first time that the uniformity of the oxide film is improved by performing the UV ozone treatment on the GaAs single crystal substrate while heating the GaAs single crystal substrate. Furthermore, the present inventors have found that the heating temperature range is suitably greater than or equal to 100° C. and less than or equal to 200° C., and more preferably greater than or equal to 150° C. and less than or equal to 200° C.

<Etching Process S3>

In an etching process S3, the main surface of the GaAs single crystal substrate precursor is brought into contact with the acidic aqueous solution, and the oxide film is etched. Hydrofluoric acid or hydrochloric acid can be used as the acidic aqueous solution. Etching process S3 may include a process including cleaning by the ultrapure water rinse and drying of the GaAs single crystal substrate precursor etched with the oxide film. Because the ultrapure water used for the ultrapure water rinse is the same as the ultrapure water used for the ultrapure water rinse in the coarse cleaning process, the description will not be repeated. The drying method is not particularly limited, but a spin drying method is preferable.

<Analysis Process S4>

The method for producing the GaAs single crystal substrate preferably includes an analysis process S4. Analysis process S4 is a process of, after etching process S3, measuring the main surface of the GaAs single crystal substrate precursor by the X-ray photoelectron spectroscopy using the X-rays having the energy of 150 eV and setting the photoelectron take-off angle to 5°, and analyzing the ratio of the number of As atoms existing as the diarsenic trioxide to the number of As atoms existing as the diarsenic pentoxide. Analysis process S4 may be performed as a sampling inspection. The GaAs single crystal substrate in which the ratio As(3+)/As(5+) on the extreme surface of the main surface is greater than or equal to 2 can be more reliably produced when analysis process S4 is executed.

In the GaAs single crystal substrate obtained by the method for producing the GaAs single crystal substrate, the orientation of the main surface can be a plane having the off angle greater than or equal to 0.01° and less than or equal to 15° from the (100) plane, and the GaAs single crystal substrate can have the disk shape having the diameter greater than or equal to 75 mm and less than or equal to 300 mm. The surface roughness represented by the arithmetic average roughness (Ra) of the main surface of the GaAs single crystal substrate can also be the same as that of the GaAs single crystal substrate described above (less than or equal to 0.3 nm).

Japanese Patent Laying-Open No. 10-36199 (PTL 2) discloses that the GaAs substrate is heated to 580° C. to sublimate the diarsenic trioxide that is a natural oxide film. The diarsenic pentoxide can also be sublimated by heating the GaAs substrate to 580° C. Thus, the ratio of the number of As atoms existing as the diarsenic trioxide to the number of As atoms present as diarsenic pentoxide can be increased on the main surface of the GaAs substrate heated to 580° C.

However, as described in NPL 2, when the GaAs substrate is heated greater than or equal to 300° C., thermal degradation of the surface is generated due to dissociation of a group V element. Accordingly, with the technique described in PTL 2, the GaAs single crystal substrate having the main surface having arithmetic average roughness Ra less than or equal to 0.3 nm cannot be obtained. When the epitaxial film is formed on the main surface having arithmetic average roughness Ra more than 0.3 nm, because the smoothness of the main surface is poor, the number of LPDs on the film surface of the epitaxial film cannot be prevented. Furthermore, in the technique described in PTL 2, the defect density of the main surface may increase due to the thermal degradation.

NPL 3 discloses the GaAs substrate produced by performing the heating treatment at about 150° C. after etching using $H_2SO_4:H_2O_2:H_2O$ of 7:1:1. The oxide film on the surface can be removed by etching using $H_2SO_4:H_2O_2:H_2O$ of 7:1:1. However, minute irregularities are formed on the surface during the etching. Furthermore, when the surface is oxidized by being exposed to atmosphere after the etching, the uniform oxide film is not formed due to irregularities of the surface. For this reason, in the technique described in NPL 3, the GaAs single crystal substrate having the main surface having arithmetic average roughness Ra less than or equal to 0.3 nm and the ratio As(3+)/As(5+) at the extreme surface greater than or equal to 2 cannot be obtained.

<Action and Effect>

As described above, the ratio As(3+)/As(5+) on the extreme surface of the main surface of the GaAs single crystal substrate is greater than or equal to 2 according to the method for producing the GaAs single crystal substrate. When the epitaxial film is grown on the main surface of such the GaAs single crystal substrate, the number of LPDs having a diameter greater than or equal to 18 μm in the epitaxial film can be less than 4 per 1 $cm^2$ of the film surface. Thus, the GaAs single crystal substrate capable of forming the epitaxial film in which the number of LPDs is reduced can be obtained.

Example

Hereinafter, the present invention will be described in more detail with reference to Examples, but the present invention is not limited thereto.

[Producing of Samples 1 to 7]

[Sample 1]

<Producing of GaAs Single Crystal Substrate>

(Preparation of GaAs Single Crystal Substrate Precursor: Processing Process>

A semi-insulating GaAs single crystal body grown by a vertical Bridgman (VB) method and doped with carbon (C) atoms was sliced and chamfered to prepare a plurality of GaAs single crystal substrate precursors each having the diameter of 6 inches (150 mm) and the thickness of 750 μm. The specific resistance of the prepared GaAs single crystal substrate precursor was $2\times10^8$ Ω·cm. The specific resistance was measured using a Hall measurement method.

(Preparation of GaAs Single Crystal Substrate Precursor: Polishing Process)

Mechanical polishing and chemical mechanical polishing were performed on the main surface of the processed GaAs single crystal substrate precursor. Thus, the GaAs single crystal substrate precursor having arithmetic average roughness Ra specified in JIS B0601:2001 less than or equal to 0.3 nm and having the main surface with the off angle of 2° with respect to the (100) plane was prepared.

(Preparation of GaAs Single Crystal Substrate Precursor: Coarse Cleaning Process)

The polished GaAs single crystal substrate precursor was immersed in a 0.5-volume-percent aqueous tetramethylammonium hydroxide solution at room temperature (25° C.) for 5 minutes by a vertical-batch method. Thereafter, the GaAs single crystal substrate precursor was rinsed for 3 minutes with ultrapure water (the electrical resistivity (specific resistance) is greater than or equal to 18 MΩ·cm, the TOC (total organic carbon) is less than 10 μg/liter, and the number of fine particles is less than 100/liter, and the same applies hereinafter). Further, the GaAs single crystal substrate precursor was immersed in the 0.5-volume-percent aqueous tetramethylammonium hydroxide solution at room temperature (25° C.) for 5 minutes and immersed in ultrapure water at room temperature (25° C.).

(Preparation of GaAs Single-Crystal Substrate Precursor: Precision Cleaning Process)

The coarsely cleaned GaAs single crystal substrate precursor was precisely cleaned by acid cleaning, two-time ultrapure water rinsing, and spin drying by a face-down single wafer method using the cleaning apparatus in FIG. 4. In the acid cleaning, the 1-liter nitric acid aqueous solution having pH 5 was supplied to the main surface of the GaAs single crystal substrate precursor at room temperature (25° C.) for 1 minute. In the ultrapure water rinse, the 1-liter ultrapure water was supplied to the main surface of the GaAs single crystal substrate precursor at room temperature (25° C.) for 1 minute.

(Oxidation Process)

The main surface of the precision-cleaned GaAs single crystal substrate precursor was oxidized to form an oxide film using "Ozone Cleaner UV-1" produced by SAMCO CORPORATION. The oxidation was performed for 60 minutes under the oxidation conditions of a stage temperature of 150° C., an oxygen flow rate of 1 liter per minute, and simultaneous ultraviolet irradiation.

(Etching Process)

The GaAs single crystal substrate precursor in which the oxide film is formed on the main surface was etched in a solution obtained by diluting hydrofluoric acid "BHF-110U" produced by DAIKIN INDUSTRIES, LTD. with water at 100 times for 60 seconds, washed with flowing water supplied with 1 liter per minute of the ultrapure water at room temperature (25° C.) for 5 minutes, and spin-dried. Thus, a plurality of GaAs single crystal substrates of Sample 1 were prepared.

<Producing of Epitaxial Substrate>

An $Al_{0.5}Ga_{0.5}As$ layer having the thickness of 5 μm as the epitaxial layer was grown on the main surface of one of the plurality of prepared GaAs single crystal substrates by a metal-organic vapor phase epitaxy method (MOVPE method) to obtain the epitaxial substrate of Sample 1. In growing the epitaxial layer, the GaAs single crystal substrate was heated to 550° C.

[Sample 2]

A plurality of GaAs single crystal substrates of Sample 2 were prepared by the same method as in Sample 1 except that the stage temperature of the "ozone cleaner UV-1" was changed to 200° C.

Furthermore, the $Al_{0.5}Ga_{0.5}As$ layer having the thickness of 5 μm as the epitaxial layer was grown on the main surface of one of the plurality of prepared GaAs single crystal substrates of Sample 2 by the metal-organic vapor phase epitaxy method (MOVPE method) to obtain the epitaxial substrate of Sample 2. In growing the epitaxial layer, the GaAs single crystal substrate was heated to 550° C.

[Sample 3]

A plurality of GaAs single crystal substrates of Sample 3 were prepared by the same method as in Sample 1 except that the stage temperature of the "ozone cleaner UV-1" was changed to 100° C.

Furthermore, the $Al_{0.5}Ga_{0.5}As$ layer having the thickness of 5 μm as the epitaxial layer was grown on the main surface of one of the plurality of prepared GaAs single crystal substrates of Sample 3 by the metal-organic vapor phase epitaxy method (MOVPE method) to obtain the epitaxial substrate of Sample 3. In growing the epitaxial layer, the GaAs single crystal substrate was heated to 550° C.

[Sample 4]

A plurality of GaAs single crystal substrates of Sample 4 were prepared by the same method as in Sample 1 except that the stage temperature of the "ozone cleaner UV-1" was changed to 50° C.

Furthermore, the $Al_{0.5}Ga_{0.5}As$ layer having the thickness of 5 μm as the epitaxial layer was grown on the main surface of one of the plurality of prepared GaAs single crystal substrates of Sample 4 by the metal-organic vapor phase epitaxy method (MOVPE method) to obtain the epitaxial substrate of Sample 4. In growing the epitaxial layer, the GaAs single crystal substrate was heated to 550° C.

[Sample 5]

A plurality of GaAs single crystal substrates of Sample 5 were prepared by the same method as in Sample 1 except that the stage temperature of the "ozone cleaner UV-1" was changed to room temperature (25° C.).

Furthermore, the $Al_{0.5}Ga_{0.5}As$ layer having the thickness of 5 μm as the epitaxial layer was grown on the main surface of one of the plurality of prepared GaAs single crystal substrates of Sample 5 by the metal-organic vapor phase epitaxy method (MOVPE method) to obtain the epitaxial substrate of Sample 5. In growing the epitaxial layer, the GaAs single crystal substrate was heated to 550° C.

[Sample 6]

A plurality of GaAs single crystal substrates of Sample 6 were prepared by the same method as in Sample 1 except that the (oxidation process) was not performed.

Furthermore, the $Al_{0.5}Ga_{0.5}As$ layer having the thickness of 5 μm as the epitaxial layer was grown on the main surface of one of the plurality of prepared GaAs single crystal substrates of Sample 6 by the metal-organic vapor phase epitaxy method (MOVPE method) to obtain the epitaxial substrate of Sample 6. In growing the epitaxial layer, the GaAs single crystal substrate was heated to 550° C.

[Sample 7]

A plurality of GaAs single crystal substrates of Sample 7 were prepared by the same method as in Sample 1 except that the (oxidation process) and the (etching process) were not performed.

Furthermore, the $Al_{0.5}Ga_{0.5}As$ layer having the thickness of 5 μm as the epitaxial layer was grown on the main surface of one of the plurality of prepared GaAs single crystal substrates of Sample 7 by the metal-organic vapor phase epitaxy method (MOVPE method) to obtain the epitaxial substrate of Sample 7. In growing the epitaxial layer, the GaAs single crystal substrate was heated to 550° C.

[Various Analyses]

[Arithmetic Surface Roughness Ra of Main Surface of GaAs Single Crystal Substrate]

Arithmetic surface roughness Ra of the main surfaces of the GaAs single crystal substrates of Samples 1 to 7 was measured using "Dimension Edge" produced by Bruker Corporation.

[Defect Density of Main Surface of GaAs Single Crystal Substrate]

Etch pits were generated by immersing the surfaces of the GaAs single crystal substrates of Samples 1 to 7 in molten potassium hydroxide at 500° C. for 10 minutes. Thereafter, the circular region on the main surface of the GaAs single crystal substrate taken out from the molten potassium hydroxide was observed with the optical microscope (trade name: "ECLIPSE (registered trademark) LV150N" produced by Nikon Corporation) at a magnification of 100 times (one visual field has a size of 1 mm square, namely, a size of 1 mm×1 mm), thereby counting the number of etch pits in one visual field. The defect density of the main surface of the GaAs single crystal substrate was calculated from the counted number.

[Analysis of GaAs Single Crystal Substrate Using X-Ray Photoelectron Spectroscopy]

The X-ray having the energy of 150 eV was prepared using "BL17", which is one of beam lines dedicated to Sumitomo Electric Industries, Ltd., in Kyushu Synchrotron Light Research Center, Saga Prefecture. The main surfaces of the GaAs single crystal substrates of Samples 1 to 7 were irradiated with the X-ray to perform the analyses using the X-ray photoelectron spectroscopy. Because the entire GaAs single crystal substrates of Samples 1 to 7 cannot be placed on the sample stage, test pieces cut out from the GaAs single crystal substrates of Samples 1 to 7 were analyzed.

The analysis conditions are as follows.

Angle θ1 between traveling direction of X-ray incident on main surface of GaAs single crystal substrate and main surface: 85°

Photoelectron take-off angle θ2: 5°

Test piece size: 10 mm×10 mm

High resolution XPS analyzer used: "R3000" produced by Scienta Omicron

Energy resolution E/ΔE: 3480

Plot interval of binding energy: 0.02 eV

Integration time and number of integrations for each energy value: 100 ms, 50 times Pressure around test piece: $4 \times 10^{-7}$ Pa.

The ratio (ratio As(3+)/As(5+)) of the number of As atoms existing as the diarsenic trioxide to the number of As atoms present as the diarsenic pentoxide was calculated for the As3d spectrum obtained by the above analysis using the above-described calculation method.

[Measurement of Number of LPDs with Diameter Greater than or Equal to 18 μm]

The number of LPDs having the diameter greater than or equal to 18 μm per 1 $cm^2$ of the film surface of the epitaxial film was obtained by observing the film surface of the epitaxial film in the epitaxial substrates of Samples 1 to 7 using a surface inspection apparatus (Trade name: "Surf Scan 6220" produced by KLA-Tencor Corporation).

Specifically, the total number of LPDs having the diameter greater than or equal to 18 μm when converted into the equal-area circular shape was obtained by scanning the film surface of the epitaxial film in the epitaxial substrate with a laser beam using the surface inspection apparatus. Subsequently, the number of LPDs per 1 $cm^2$ of the film surface in the epitaxial film was obtained by dividing the total number of LPDs by the total area of the film surface of the epitaxial film. The number of LPDs per 1 $cm^2$ of the film surface was determined in the range excluding an annular portion within 5 mm from the outer edge of the epitaxial substrate.

[Result]

Table 1 illustrates the analysis results of the ratio As(3+)/As(5+) on the extreme surfaces of the main surfaces of the GaAs single crystal substrates of Samples 1 to 7 and the measurement results of the number of LPDs per 1 $cm^2$ of the film surfaces in the epitaxial films of the epitaxial substrates of Samples 1 to 7. Samples 1 to 3 are examples, and samples 4 to 7 are comparative examples.

TABLE 1

|  | Stage temperature (° C.) | Oxidation time (min) | Etching time (seconds) | Arithmetic surface roughness Ra (nm) | Defect density (/cm$^2$) | Ratio As(3+)/ As(5+) | Number of LPDs with diameter greater than or equal to 18 μm (/cm$^2$) |
|---|---|---|---|---|---|---|---|
| Sample 1 | 150 | 60 | 60 | 0.11 | 10 | 5.7 | 0.7 |
| Sample 2 | 200 | 60 | 60 | 0.28 | 50 | 6.2 | 1.2 |
| Sample 3 | 100 | 60 | 60 | 0.08 | 40 | 2.4 | 3.7 |
| Sample 4 | 50 | 60 | 60 | 0.35 | 120 | 1.5 | 4.4 |
| Sample 5 | 25 | 60 | 60 | 0.40 | 80 | 1.1 | 4.7 |
| Sample 6 | Not performed | | 60 | 0.31 | 50 | 1.4 | 4.1 |
| Sample 7 | Not performed | | | 0.38 | 1500 | 0.8 | 10.2 |

[Discussion]

According to Table 1, arithmetic average roughness Ra of the main surfaces of the GaAs single crystal substrates of Samples 1 to 3 was less than or equal to 0.3 nm, and the ratio As(3+)/As(5+) on the extreme surface of the main surface was greater than or equal to 2. In this case, in the epitaxial film formed on the main surface of the GaAs single crystal substrate, the number of LPDs having the diameter greater than or equal to 18 μm per 1 cm$^2$ of the film surface was less than 4.

Furthermore, the ratio As(3+)/As(5+) on the extreme surface of the main surface of the GaAs single crystal substrate of each of Samples 1 and 2 was greater than or equal to 5. In this case, in the epitaxial film formed on the main surface of the GaAs single crystal substrate, the number of LPDs having a diameter greater than or equal to 18 μm per 1 cm$^2$ of the film surface was less than 2.

On the other hand, arithmetic average roughness Ra of the main surfaces of the GaAs single crystal substrates of Samples 4 to 7 was more than 0.3 nm, and the ratio As(3+)/As(5+) on the extreme surface of the main surface was less than 2. In this case, in the epitaxial film formed on the main surface of the GaAs single crystal substrate, the number of LPDs having the diameter greater than or equal to 18 μm per 1 cm$^2$ of the film surface exceeded 4.

NPL 2 discloses a technique of washing using ultrapure water having a low dissolved oxygen concentration. The GaAs single crystal substrate of Sample 6 is produced by performing the processing process, the polishing process, the coarse cleaning process, the precision cleaning process, and the etching process. The ultrapure water used in the coarse cleaning process, the precision cleaning process, and the etching process is prepared by bubbling with high purity nitrogen, and has a low dissolved oxygen concentration. For this reason, Sample 6 corresponds to the GaAs single crystal substrate prepared using the technique disclosed in NPL 2.

As illustrated in Table 1, the ratio As(3+)/As(5+) on the extreme surface of the GaAs single crystal substrate of Sample 6 was less than 2. In the epitaxial substrate of Sample 6, the number of LPDs having the diameter greater than or equal to 18 μm per 1 cm$^2$ of the film surface exceeded 4. Consequently, it has been checked that the GaAs single crystal substrate having the main surface with the ratio As(3+)/As(5+) greater than or equal to 2 cannot be produced by the technique disclosed in NPL 2. Furthermore, it has been checked that the technique disclosed in NPL 2 cannot prevent LPDs greater than or equal to 18 μm in the diameter per 1 cm$^2$ of the film surface to less than or equal to 4 in the epitaxial film formed on the main surface.

[Additional Analysis of Samples 1 to 7]

The distribution of the ratio As(3+)/As(5+) on the main surfaces of the GaAs single crystal substrates of Samples 1 to 7 was analyzed. The ratio As(3+)/As(5+) was analyzed for each of the nine test pieces cut out from the GaAs single crystal substrates of Samples 1 to 7 according to the same method as the above [analysis of GaAs single crystal substrate using X-ray photoelectron spectroscopy]. Each of the nine test pieces includes first measurement point P1, second measurement point P2, third measurement point P3, fourth measurement point P4, fifth measurement point P5, sixth measurement point P6, seventh measurement point P7, eighth measurement point P8, and ninth measurement point P9 in FIG. 5. Then, nine test pieces were installed in the high-resolution XPS analyzer such that first measurement point P1, second measurement point P2, third measurement point P3, fourth measurement point P4, fifth measurement point P5, sixth measurement point P6, seventh measurement point P7, eighth measurement point P8, and ninth measurement point P9 were irradiated with the X-ray.

Furthermore, the distribution of the number of LPDs having the diameter greater than or equal to 18 μm per 1 cm$^2$ of the film surface on the main surfaces of the epitaxial substrates of Samples 1 to 7 was analyzed. For each of the nine measurement regions on the main surfaces of the epitaxial substrates of Samples 1 to 7, the number of LPDs with the diameter greater than or equal to 18 μm per 1 cm$^2$ of the film surface was measured according to the same method as in [measurement of the number of LPDs with diameter greater than or equal to 18 μm]. The nine measurement regions are circular regions having the diameter of 30 mm centered on first measurement point P1, second measurement point P2, third measurement point P3, fourth measurement point P4, fifth measurement point P5, sixth measurement point P6, seventh measurement point P7, eighth measurement point P8, and ninth measurement point P9 in FIG. 5.

[Results of Additional Analysis]

Tables 2 to 8 illustrate the results of additional analysis on GaAs single crystal substrates and epitaxial substrates of Samples 1 to 7.

TABLE 2

| Measurement point | Coordinate (X, Y) | Ratio As(3+)/As(5+) | Arithmetic average roughness Ra (nm) | Number of LPDs with diameter greater than or equal to 18 μm (/cm$^2$) |
|---|---|---|---|---|
| P1 | (0, 0) | 5.7 | 0.08 | 0.7 |
| P2 | (37.5, 0) | 5.3 | 0.12 | 0.6 |

TABLE 2-continued

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P3 | (0, 37.5) | 6.6 | 0.11 | 0.6 |
| P4 | (−37.5, 0) | 5.5 | 0.08 | 0.7 |
| P5 | (0, −37.5) | 5.3 | 0.12 | 0.8 |
| P6 | (38, 38) | 5.3 | 0.12 | 0.8 |
| P7 | (−38, 38) | 5.2 | 0.13 | 0.8 |
| P8 | (−38, −38) | 5.9 | 0.13 | 0.7 |
| P9 | (38, −38) | 6.1 | 0.14 | 0.6 |
| Average | | 5.7 | 0.11 | 0.7 |
| Standard deviation σ | | 0.44 | 0.02 | 0.12 |

TABLE 3

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 7.1 | 0.22 | 0.8 |
| P2 | (37.5, 0) | 6.2 | 0.29 | 1.0 |
| P3 | (0, 37.5) | 4.5 | 0.28 | 1.3 |
| P4 | (−37.5, 0) | 5.9 | 0.29 | 1.1 |
| P5 | (0, −37.5) | 7.8 | 0.24 | 0.8 |
| P6 | (38, 38) | 6.1 | 0.28 | 1.1 |
| P7 | (−38, 38) | 6.4 | 0.29 | 1.3 |
| P8 | (−38, −38) | 5.7 | 0.31 | 1.7 |
| P9 | (38, −38) | 5.8 | 0.32 | 1.6 |
| Average | | 6.2 | 0.28 | 1.2 |
| Standard deviation σ | | 0.87 | 0.03 | 0.28 |

TABLE 4

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 2.1 | 0.04 | 3.7 |
| P2 | (37.5, 0) | 1.8 | 0.06 | 3.8 |
| P3 | (0, 37.5) | 3.2 | 0.05 | 1.1 |
| P4 | (−37.5, 0) | 1.9 | 0.08 | 3.5 |
| P5 | (0, −37.5) | 4.2 | 0.11 | 1.6 |
| P6 | (38, 38) | 3.6 | 0.13 | 2.3 |
| P7 | (−38, 38) | 2.4 | 0.11 | 5.1 |
| P8 | (−38, −38) | 1.1 | 0.11 | 6.8 |
| P9 | (38, −38) | 1.4 | 0.07 | 5.5 |
| Average | | 2.4 | 0.08 | 3.7 |
| Standard deviation σ | | 0.98 | 0.03 | 1.77 |

TABLE 5

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 0.6 | 0.36 | 5.8 |
| P2 | (37.5, 0) | 1.1 | 0.34 | 4.7 |
| P3 | (0, 37.5) | 1.6 | 0.32 | 4.1 |
| P4 | (−37.5, 0) | 0.5 | 0.41 | 6.4 |
| P5 | (0, −37.5) | 0.7 | 0.42 | 7.2 |
| P6 | (38, 38) | 0.8 | 0.35 | 3.5 |

TABLE 5-continued

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P7 | (−38, 38) | 5.2 | 0.28 | 0.8 |
| P8 | (−38, −38) | 2.8 | 0.32 | 1.6 |
| P9 | (38, −38) | 0.5 | 0.38 | 5.8 |
| Average | | 1.5 | 0.35 | 4.4 |
| Standard deviation σ | | 1.47 | 0.04 | 2.00 |

TABLE 6

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 1.0 | 0.34 | 3.8 |
| P2 | (37.5, 0) | 0.5 | 0.47 | 8.9 |
| P3 | (0, 37.5) | 0.7 | 0.48 | 7.2 |
| P4 | (−37.5, 0) | 4.4 | 0.32 | 2.3 |
| P5 | (0, −37.5) | 1.2 | 0.32 | 3.5 |
| P6 | (38, 38) | 2.9 | 0.40 | 3.3 |
| P7 | (−38, 38) | 0.7 | 0.40 | 3.1 |
| P8 | (−38, −38) | 0.5 | 0.42 | 5.0 |
| P9 | (38, −38) | 0.6 | 0.44 | 5.2 |
| Average | | 1.1 | 0.40 | 4.7 |
| Standard deviation σ | | 1.27 | 0.06 | 2.03 |

TABLE 7

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 0.8 | 0.35 | 4.1 |
| P2 | (37.5, 0) | 0.6 | 0.37 | 6.5 |
| P3 | (0, 37.5) | 0.6 | 0.37 | 5.2 |
| P4 | (−37.5, 0) | 3.9 | 0.19 | 1.1 |
| P5 | (0, −37.5) | 1.2 | 0.37 | 6.2 |
| P6 | (38, 38) | 1.1 | 0.35 | 3.3 |
| P7 | (−38, 38) | 0.6 | 0.39 | 5.2 |
| P8 | (−38, −38) | 2.8 | 0.19 | 2.1 |
| P9 | (38, −38) | 1.4 | 0.25 | 2.8 |
| Average | | 1.4 | 0.31 | 4.1 |
| Standard deviation σ | | 1.09 | 0.08 | 1.76 |

TABLE 8

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 0.6 | 0.57 | 12.2 |
| P2 | (37.5, 0) | 0.5 | 0.28 | 9.6 |
| P3 | (0, 37.5) | 1.7 | 0.22 | 5.4 |
| P4 | (−37.5, 0) | 0.6 | 0.48 | 12.2 |
| P5 | (0, −37.5) | 1.3 | 0.25 | 4.2 |
| P6 | (38, 38) | 1.1 | 0.28 | 6.1 |
| P7 | (−38, 38) | 0.7 | 0.48 | 12.3 |
| P8 | (−38, −38) | 0.6 | 0.52 | 15.3 |
| P9 | (38, −38) | 0.5 | 0.38 | 14.9 |
| Average | | 0.8 | 0.38 | 10.2 |
| Standard deviation σ | | 0.40 | 0.12 | 3.88 |

According to Tables 2 to 4, in each of the GaAs single crystal substrates of Samples 1 to 3, the average value of the ratio As(3+)/As(5+) between first measurement point P1 and ninth measurement point P9 was greater than or equal to 2, and the standard deviation was less than or equal to 1. The average value of the number of LPDs per 1 cm$^2$ of the film surface in the epitaxial film formed in the measurement region including first measurement point P1 to ninth measurement point P9 was less than 4, and the standard deviation was less than 2. As described above, the dispersion in the number of LPDs per 1 cm$^2$ of the film surface is also prevented by preventing the variation in the ratio As(3+)/As(5+) on the main surface of the GaAs single crystal substrate.

On the other hand, according to Tables 5 and 8, in each of the GaAs single crystal substrates of Samples 4 and 7, the average value of the ratio As(3+)/As(5+) of first measurement point P1 to ninth measurement point P9 was less than 2. For this reason, the average value and the standard deviation of the number of LPDs per 1 cm$^2$ of the film surface increase in the epitaxial film formed in the measurement region including first measurement point P1 to ninth measurement point P9.

[Preparation of Samples 8 to 10]

[Sample 8]

A plurality of GaAs single crystal substrates of Sample 8 were prepared by the same method as in Sample 1 except that the plurality of GaAs single crystal substrate precursors having the diameter of 8 inches (200 mm) and the thickness of 750 μm were used. Similarly to Sample 1, the GaAs single crystal substrate precursor was prepared by slicing and chamfering the semi-insulating GaAs single crystal doped with carbon (C) atoms and grown by the vertical Bridgman (VB) method.

Furthermore, the $Al_{0.5}Ga_{0.5}As$ layer having the thickness of 5 μm as the epitaxial layer was grown on the main surface of one of the plurality of prepared GaAs single crystal substrates of Sample 8 by the metal-organic vapor phase epitaxy method (MOVPE method) to obtain the epitaxial substrate of Sample 8. In growing the epitaxial layer, the GaAs single crystal substrate was heated to 550° C.

[Sample 9]

A plurality of GaAs single crystal substrates of Sample 9 were prepared by the same method as in Sample 6 except that the plurality of GaAs single crystal substrate precursors having the diameter of 8 inches (200 mm) and the thickness of 750 μm were used. Similarly to Sample 1, the GaAs single crystal substrate precursor was prepared by slicing and chamfering the semi-insulating GaAs single crystal doped with carbon (C) atoms and grown by the vertical Bridgman (VB) method.

Furthermore, the $Al_{0.5}Ga_{0.5}As$ layer having the thickness of 5 μm as the epitaxial layer was grown on the main surface of one of the plurality of prepared GaAs single crystal substrates of Sample 9 by the metal-organic vapor phase epitaxy method (MOVPE method) to obtain the epitaxial substrate of Sample 9. In growing the epitaxial layer, the GaAs single crystal substrate was heated to 550° C.

[Sample 10]

A plurality of GaAs single crystal substrates of Sample 10 were prepared by the same method as in Sample 7 except that the plurality of GaAs single crystal substrate precursors having the diameter of 8 inches (200 mm) and the thickness of 750 μm were used. Similarly to Sample 1, the GaAs single crystal substrate precursor was prepared by slicing and chamfering the semi-insulating GaAs single crystal doped with carbon (C) atoms and grown by the vertical Bridgman (VB) method.

Furthermore, the $Al_{0.5}Ga_{0.5}As$ layer having the thickness of 5 μm as the epitaxial layer was grown on the main surface of one of the plurality of prepared GaAs single crystal substrates of Sample 10 by the metal-organic vapor phase epitaxy method (MOVPE method) to obtain the epitaxial substrate of Sample 10. In growing the epitaxial layer, the GaAs single crystal substrate was heated to 550° C.

[Analysis of Samples 8 to 10]

The distribution of the ratio As(3+)/As(5+) on the main surfaces of the GaAs single crystal substrates of Samples 8 to 10 was analyzed. The ratio As(3+)/As(5+) was analyzed for each of the nine test pieces cut out from the GaAs single crystal substrate of Samples 8 to 10 according to the same method as the above [analysis using X-ray photoelectron spectroscopy for GaAs single crystal substrate]. Each of the nine test pieces includes first measurement point P1, second measurement point P2, third measurement point P3, fourth measurement point P4, fifth measurement point P5, sixth measurement point P6, seventh measurement point P7, eighth measurement point P8, and ninth measurement point P9 in FIG. 6. Then, nine test pieces were installed in the high-resolution XPS analyzer such that first measurement point P1, second measurement point P2, third measurement point P3, fourth measurement point P4, fifth measurement point P5, sixth measurement point P6, seventh measurement point P7, eighth measurement point P8, and ninth measurement point P9 were irradiated with the X-ray.

For the GaAs single crystal substrates of Samples 8 to 10, the average value of arithmetic average roughness Ra at first measurement point P1, second measurement point P2, third measurement point P3, fourth measurement point P4, fifth measurement point P5, sixth measurement point P6, seventh measurement point P7, eighth measurement point P8, and ninth measurement point P9 was measured. Arithmetic surface roughness Ra at each measurement point was measured using "Dimension Edge" produced by Bruker Corporation.

Furthermore, the distribution of the number of LPDs having the diameter greater than or equal to 18 μm per 1 cm$^2$ of the film surface on the main surfaces of the epitaxial substrates of Samples 8 to 10 was analyzed. For each of the nine measurement regions on the main surfaces of the epitaxial substrates of Samples 1 to 7, the number of LPDs per 1 cm$^2$ of the film surface was measured according to the same method as in [measurement of the number of LPDs with diameter greater than or equal to 18 μm]. The nine measurement regions are circular regions having the diameter of 30 mm centered on first measurement point P1, second measurement point P2, third measurement point P3, fourth measurement point P4, fifth measurement point P5, sixth measurement point P6, seventh measurement point P7, eighth measurement point P8, and ninth measurement point P9 in FIG. 6.

[Results of Analysis of Samples 8 to 10]

Tables 9 to 11 illustrate the results of additional analysis for the GaAs single crystal substrates and the epitaxial substrates of samples 8 to 10. Sample 8 is an example, and samples 9 and 10 are comparative examples.

TABLE 9

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 5.8 | 0.09 | 0.8 |
| P2 | (50, 0) | 5.2 | 0.20 | 1.0 |
| P3 | (0, 50) | 6.6 | 0.11 | 0.6 |
| P4 | (−50, 0) | 5.4 | 0.13 | 0.8 |
| P5 | (0, −50) | 5.2 | 0.08 | 0.8 |
| P6 | (56, 56) | 5.6 | 0.09 | 0.8 |
| P7 | (−56, 56) | 4.4 | 0.22 | 1.1 |
| P8 | (−56, −56) | 4.8 | 0.08 | 0.8 |
| P9 | (56, −56) | 5.2 | 0.15 | 0.7 |
| Average | | 5.3 | 0.13 | 0.9 |
| Standard deviation σ | | 0.59 | 0.05 | 0.14 |

TABLE 10

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 1.1 | 0.38 | 4.1 |
| P2 | (50, 0) | 0.5 | 0.55 | 12.3 |
| P3 | (0, 50) | 0.7 | 0.38 | 8.2 |
| P4 | (−50, 0) | 4.5 | 0.22 | 1.1 |
| P5 | (0, −50) | 1.8 | 0.38 | 3.8 |
| P6 | (56, 56) | 0.9 | 0.33 | 5.7 |
| P7 | (−56, 56) | 2.2 | 0.44 | 5.2 |
| P8 | (−56, −56) | 1.9 | 0.38 | 3.8 |
| P9 | (56, −56) | 2.9 | 0.32 | 2.5 |
| Average | | 1.8 | 0.38 | 5.2 |
| Standard deviation σ | | 1.20 | 0.08 | 3.13 |

TABLE 11

| Measurement point | Coordinate (X, Y) | Ratio As(3+)/As(5+) | Arithmetic average roughness Ra (nm) | Number of LPDs with diameter greater than or equal to 18 μm (/cm²) |
|---|---|---|---|---|
| P1 | (0, 0) | 0.5 | 0.48 | 12.7 |
| P2 | (50, 0) | 0.6 | 0.42 | 10.0 |
| P3 | (0, 50) | 1.7 | 0.36 | 5.9 |
| P4 | (−50, 0) | 0.6 | 0.42 | 12.7 |
| P5 | (0, −50) | 1.6 | 0.28 | 4.7 |
| P6 | (56, 56) | 1.1 | 0.48 | 9.3 |
| P7 | (−56, 56) | 0.6 | 0.42 | 8.6 |
| P8 | (−56, −56) | 0.8 | 0.42 | 15.3 |
| P9 | (56, −56) | 0.7 | 0.52 | 18.5 |
| Average | | 0.9 | 0.42 | 10.9 |
| Standard deviation σ | | 0.43 | 0.07 | 4.18 |

According to Table 9, in the GaAs single crystal substrate of Sample 8, the average value of the ratio As(3+)/As(5+) between first measurement point P1 and ninth measurement point P9 was greater than or equal to 5, and the standard deviation was less than or equal to 1. The average value of the arithmetic average roughness Ra from first measurement point P1 to ninth measurement point P9 was less than or equal to 0.3 nm. The average value of the number of LPDs per 1 cm² of the film surface in the epitaxial film formed in the measurement region including first measurement point P1 to ninth measurement point P9 was less than 1, and the standard deviation was less than 1. As described above, the dispersion in the ratio As(3+)/As(5+) is prevented even on the main surface of the large GaAs single crystal substrate having the diameter of 8 inches (200 mm), and the dispersion in the number of LPDs per 1 cm² of the film surface is prevented.

On the other hand, according to Tables 10 and 11, in each of the GaAs single crystal substrates of Samples 9 and 10, the average value of the ratio As(3+)/As(5+) of first measurement point P1 to ninth measurement point P9 was less than 2. For this reason, the average value and the standard deviation of the number of LPDs per 1 cm² of the film surface increase in the epitaxial film formed in the measurement region including first measurement point P1 to ninth measurement point P9.

Although the embodiment and example of the present invention have been described above, it is also planned from the beginning that the configurations of the above-described embodiment and examples are appropriately combined.

It should be considered that the disclosed embodiment and example are an example in all respects and not restrictive. The scope of the present invention is defined not by the embodiment and the example but by the claims, and is intended to include meanings equivalent to the claims and all modifications within the scope.

REFERENCE SIGNS LIST

1: GaAs single crystal substrate, 1m, 2m: main surface, 2: GaAs single crystal substrate precursor, 10: X-ray generation facility, 11: X-ray source, 12, 14: slit, 13: grating, 20: vacuum vessel, 30: electron spectrometer, 40: cleaning apparatus, 41: holder, 43: cleaning solution tank, 45: chamber, 50: notch, 51, 52, 53: circumference, 100: analysis system, C: cleaning solution, L: solid line, L1: one-dot chain line, L2: two-dot chain line, L3, L4: broken line, L5: dotted line

The invention claimed is:

1. A gallium arsenide single crystal substrate having a main surface, wherein
a ratio of a number of As atoms existing as diarsenic trioxide to a number of As atoms existing as diarsenic pentoxide is greater than or equal to 2 when the main surface is measured by X-ray photoelectron spectroscopy, in which an X-ray having an energy of 150 eV is used and a take-off angle of a photoelectron is set to 5°, and
arithmetic average roughness Ra of the main surface is less than or equal to 0.3 nm.

2. The gallium arsenide single crystal substrate according to claim 1, wherein the ratio of the number of As atoms existing as the diarsenic trioxide to the number of As atoms existing as the diarsenic pentoxide is greater than or equal to 5 when the main surface is measured by the X-ray photoelectron spectroscopy.

3. The gallium arsenide single crystal substrate according to claim 1, wherein the main surface is a surface having an off angle greater than or equal to 0.01° and less than or equal to 15° with respect to a (100) plane.

4. The gallium arsenide single crystal substrate according to claims 1, wherein the gallium arsenide single crystal substrate has a disk shape having a diameter greater than or equal to 75 mm and less than or equal to 300 mm.

5. The gallium arsenide single crystal substrate according to claim 4, wherein
when nine measurement points on the main surface are measured by the X-ray photoelectron spectroscopy, a standard deviation of a ratio of the number of As atoms existing as the diarsenic trioxide to the number of As atoms existing as the diarsenic pentoxide is less than or equal to 1, and
when the diameter is set to D mm, and when two axes passing through a center of the main surface and orthogonal to each other on the main surface are set to an X-axis and a Y-axis, coordinates (X, Y) of the X-axis and the Y-axis at the nine measurement points are (0,0),(D/4,0), (0,D/4), (-D/4,0), (0,-D/4), $((D-40)/8^{1/2}, (D-40)/8^{1/2})$, $(-(D-40)/8^{1/2}, (D-40)/8^{1/2})$, $(-(D-40)/8^{1/2}, -(D-40)/8^{1/2})$, and $((D-40)/8^{1/2}, -(D-40)/8^{1/2})$.

6. The gallium arsenide single crystal substrate according to claim 5, wherein a diameter of the gallium arsenide single crystal substrate is greater than or equal to 150 mm and less than or equal to 200 mm.

7. A gallium arsenide single crystal substrate having a main surface, wherein
the gallium arsenide single crystal substrate has a disk shape having a diameter greater than or equal to 75 mm and less than or equal to 300 mm,
when nine measurement points on the main surface are measured by X-ray photoelectron spectroscopy, in which an X-ray having an energy of 150 eV is used and a take-off angle of a photoelectron is set to 5°, an average value of a ratio of a number of As atoms existing as diarsenic trioxide to a number of As atoms existing as diarsenic pentoxide is greater than or equal to 2, and a standard deviation of the ratios is less than or equal to 1,
when the diameter is set to D mm, and when two axes that pass through a center of the main surface and are orthogonal to each other on the main surface are set to an X-axis and a Y-axis, coordinates (X, Y) of the X-axis and the Y-axis of the nine measurement points are (0,0), (D/4,0), (0,D/4), (-D/4,0), (0,-D/4), $((D-40)/8^{1/2}, (D-40)/8^{1/2})$, $(-(D-40)/8^{1/2}, (D-40)/8^{1/2})$, $(-(D-40)/8^{1/2}, -(D-40)/8^{1/2})$, and $((D-40)/8^{1/2}, -(D-40)/8^{1/2})$, and
an average value of arithmetic average roughness Ra at the nine measurement points is less than or equal to 0.3 nm.

8. A method for producing a gallium arsenide single crystal substrate, the method comprising:
forming an oxide film on a main surface of a gallium arsenide single crystal substrate precursor by using at least one of an ozone gas and an ultraviolet ray while heating the gallium arsenide single crystal substrate precursor under a heating condition greater than or equal to 100° C. and less than or equal to 200° C.; and
bringing the main surface into contact with an acidic aqueous solution to etch the oxide film.

9. The method for producing the gallium arsenide single crystal substrate according to claim 8, wherein the heating condition is greater than or equal to 150° C. and less than or equal to 200° C.

10. The method for producing the gallium arsenide single crystal substrate according to claim 8, wherein the acidic aqueous solution is a solution containing hydrofluoric acid.

11. The method for producing the gallium arsenide single crystal substrate according to claims 8, further comprising, after the etching the oxide film, measuring the main surface by X-ray photoelectron spectroscopy using an X-ray having energy of 150 eV and setting a take-off angle of a photoelectron to 5° to analyze a ratio of the number of As atoms existing as diarsenic trioxide to the number of As atoms existing as diarsenic pentoxide.

* * * * *

UNITED STATES PATENT AND TRADEMARK OFFICE
CERTIFICATE OF CORRECTION

PATENT NO. : 11,891,720 B2
APPLICATION NO. : 17/784653
DATED : February 6, 2024
INVENTOR(S) : Koji Uematsu, Issei Satoh and Fumitake Nakanishi It is certified that error appears in the above-identified patent and that said Letters Patent is hereby corrected as shown below:

On the Title Page

Item (30), should read -- Foreign Application Priority Data
March 2, 2020 (JP) ..................... PCT/JP2020/008590 --

Signed and Sealed this
Twelfth Day of March, 2024

Katherine Kelly Vidal
*Director of the United States Patent and Trademark Office*